United States Patent
Kim et al.

(10) Patent No.: US 12,376,408 B2
(45) Date of Patent: Jul. 29, 2025

(54) IMAGE SENSORS HAVING DUAL-SURFACE ISOLATION REGIONS AND DEEP THROUGH-SUBSTRATE CONTACTS AND METHODS OF FORMING SAME

(71) Applicant: Samsung Electronics Co., Ltd., Suwon-si (KR)

(72) Inventors: Jinyoung Kim, Suwon-si (KR); Taehun Lee, Suwon-si (KR); Jihee Yang, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 500 days.

(21) Appl. No.: 17/714,071

(22) Filed: Apr. 5, 2022

(65) Prior Publication Data
US 2022/0359586 A1 Nov. 10, 2022

(30) Foreign Application Priority Data
May 7, 2021 (KR) .................. 10-2021-0059509

(51) Int. Cl.
*H10F 39/00* (2025.01)
(52) U.S. Cl.
CPC ....... *H10F 39/807* (2025.01); *H10F 39/8053* (2025.01); *H10F 39/8063* (2025.01); *H10F 39/811* (2025.01)
(58) Field of Classification Search
CPC ........... H01L 27/1463; H01L 27/14621; H01L 27/14627; H01L 27/14636; H01L 27/14605; H01L 27/14645; H01L 27/14683; H01L 27/14603;
(Continued)

(56) References Cited

U.S. PATENT DOCUMENTS

| 9,281,328 B2 | 3/2016 | Ohno et al. |
| 10,615,200 B2 | 4/2020 | Lee |
| 10,644,051 B2 | 5/2020 | Nah et al. |

(Continued)

FOREIGN PATENT DOCUMENTS

| CN | 107195649 B | 9/2019 |
| CN | 111933574 A | 11/2020 |

(Continued)

*Primary Examiner* — Bitew A Dinke
(74) *Attorney, Agent, or Firm* — Myers Bigel, P.A.

(57) ABSTRACT

An image sensor includes a semiconductor substrate having first and second opposing surfaces thereon and a photoelectric conversion region of first conductivity type therein, which extends between the first and second surfaces. A two-dimensional array of semiconductor photoelectric conversion devices of second conductivity type is provided within the photoelectric conversion region. A first grid-shaped isolation region is provided, which extends into the photoelectric conversion region from the first surface, and has a first electrically conductive material therein. A second grid-shaped isolation region is provided, which extends into the photoelectric conversion region from the second surface. An electrically conductive contact region is provided, which (i) extends on the second surface and into a portion of the photoelectric conversion region that is outside the two-dimensional array of semiconductor photoelectric conversion devices, and (ii) electrically contacts a portion of the first electrically conductive material within the first grid-shaped isolation region.

16 Claims, 18 Drawing Sheets

(58) Field of Classification Search
CPC ............. H01L 27/14643; H10F 39/807; H10F 39/8053; H10F 39/8063; H10F 39/811
See application file for complete search history.

(56) References Cited

U.S. PATENT DOCUMENTS

| | | | | |
|---|---|---|---|---|
| 11,502,120 | B2* | 11/2022 | Watanabe | H01L 27/14643 |
| 11,749,702 | B2* | 9/2023 | Kim | H01L 27/1463 |
| | | | | 257/291 |
| 11,810,937 | B2* | 11/2023 | Jung | H01L 27/1463 |
| 2010/0155868 | A1* | 6/2010 | Jang | H01L 27/14621 |
| | | | | 257/E31.127 |
| 2014/0246707 | A1* | 9/2014 | Koo | H10F 39/80373 |
| | | | | 257/230 |
| 2015/0255495 | A1* | 9/2015 | Park | H01L 27/14621 |
| | | | | 257/446 |
| 2015/0372031 | A1* | 12/2015 | Yoon, | H01L 27/1463 |
| | | | | 257/446 |
| 2018/0204874 | A1* | 7/2018 | Lee | H04N 25/11 |
| 2018/0286895 | A1* | 10/2018 | Watanabe | H01L 27/14683 |
| 2019/0067356 | A1* | 2/2019 | Lin | H01L 27/1463 |
| 2019/0103437 | A1* | 4/2019 | Su | H01L 27/14627 |
| 2019/0131340 | A1* | 5/2019 | Kim | H01L 27/1463 |
| 2019/0148427 | A1* | 5/2019 | Lee | H01L 27/14603 |
| | | | | 257/446 |
| 2019/0148439 | A1* | 5/2019 | Shin | H01L 27/1463 |
| | | | | 257/443 |
| 2019/0252425 | A1* | 8/2019 | Ogawa | H01L 27/1463 |
| 2019/0252426 | A1* | 8/2019 | Lee | H01L 27/14623 |
| 2019/0378865 | A1 | 12/2019 | Zhang | |
| 2020/0035732 | A1* | 1/2020 | Cheng | H10F 39/811 |
| 2020/0075643 | A1* | 3/2020 | Han | H01L 27/14621 |
| 2020/0119067 | A1 | 4/2020 | Choi | |
| 2020/0119072 | A1* | 4/2020 | Lim | H10F 39/199 |
| 2020/0279877 | A1* | 9/2020 | Kim | H01L 27/1464 |
| 2020/0279886 | A1* | 9/2020 | Shin | H10F 39/199 |
| 2020/0403025 | A1* | 12/2020 | Kim | H01L 27/1464 |
| 2022/0231067 | A1* | 7/2022 | Huang | H10F 39/026 |
| 2023/0197754 | A1* | 6/2023 | Jeon | H01L 27/14636 |
| | | | | 257/292 |
| 2023/0395635 | A1* | 12/2023 | Han | H10F 39/12 |
| 2024/0266376 | A1* | 8/2024 | Noh | H10F 39/199 |

FOREIGN PATENT DOCUMENTS

| | | |
|---|---|---|
| JP | 2019140219 A | 8/2019 |
| KR | 20150105076 A | 9/2015 |
| KR | 20160017623 A | 2/2016 |
| KR | 20190041830 A | 4/2019 |
| KR | 20190054447 A | 5/2019 |
| KR | 20200042034 A | 4/2020 |

* cited by examiner

IMAGE SENSORS HAVING DUAL-SURFACE ISOLATION REGIONS AND DEEP THROUGH-SUBSTRATE CONTACTS AND METHODS OF FORMING SAME

REFERENCE TO PRIORITY APPLICATION

This application claims priority under 35 U.S.C. § 119 to Korean Patent Application No. 10-2021-0059509, filed May 7, 2021, the disclosure of which is hereby incorporated herein by reference in its entirety.

BACKGROUND

The inventive concept relates to an image sensor and, more particularly, to an image sensor having enhanced electrical characteristics and methods of forming same.

An image sensor converts an optical image into an electrical signal. Commonly used image sensors include charge coupled device (CCD) image sensors and complementary metal-oxide-semiconductor (CMOS) image sensors (CIS). These image sensors have a plurality of pixels arranged in a two-dimensional matrix, and each of the plurality of pixels outputs an image signal on the basis of light energy received by that pixel. In particular, each of the plurality of pixels accumulates photocharges corresponding to an amount of light incident on a photoelectric conversion device, and outputs a pixel signal based on the accumulated photocharges. Recently, as the degree of integration of an image sensor has been increased, the size of each pixel has decreased (along with a reduction in size of the components of each pixel's corresponding circuit).

SUMMARY

The inventive concept provides an image sensor having a structure with improved electrical characteristics by completely insulating a backside contact array (BCA) from a photoelectric conversion region.

According to an aspect of the inventive concept, there is provided an image sensor, including a substrate having a first surface and a second surface which face each other and a photoelectric conversion region within the substrate. A first isolation region is provided, which is arranged in the substrate in a vertical direction from the first surface. A second isolation region is provided, which is arranged in the substrate in a vertical direction from the second surface and corresponds (in plan view perspective) to the first isolation region. A photoelectric conversion device is provided, which is arranged in the substrate in a central portion of the photoelectric conversion region. An enhanced contact region is provided, which is electrically connected to the first isolation region in a vertical direction from the second surface (in a peripheral portion of the photoelectric conversion region). In addition, within the photoelectric conversion region, a width of the second isolation region in the peripheral portion is greater than a width of the second isolation region in the central portion.

According to another aspect of the inventive concept, there is provided an image sensor that includes a substrate having a first surface and a second surface, which face each other, and a photoelectric conversion region in the substrate. A first isolation region is provided, which is arranged in the substrate in a vertical direction from the first surface. A second isolation region is provided, which is arranged in the substrate in a vertical direction from the second surface (and may "mirror," in plan view, the opposing first isolation region). A photoelectric conversion device is provided, which is arranged in the substrate in a central portion of the photoelectric conversion region. And, a contact region is provided on the second surface, which is electrically connected to the first isolation region in the vertical direction. This contact region extends in a peripheral portion of the photoelectric conversion region. In addition, according to some embodiments of the inventive concept, a width of the first isolation region in the peripheral portion is greater than a width of the first isolation region in the central portion.

According to a further aspect of the inventive concept, an image sensor is provided with a substrate having a front surface and a back surface which face each other. A photoelectric conversion region and a pad region, which surrounds the photoelectric conversion region, are also provided. A first isolation region is provided in the photoelectric conversion region. This first isolation region has a grid shape in the substrate in a vertical direction from the front surface, and includes a conductive material film and an insulating material film surrounding the conductive material film. A second isolation region is also provided in the photoelectric conversion region. The second isolation region has a grid shape in the substrate in a vertical direction from the back surface, to thereby face the first isolation region, and includes an insulating material film. A contact region is provided, which is electrically connected to the conductive material film of the first isolation region in the vertical direction (from the back surface). A photoelectric conversion device is arranged inside the photoelectric conversion region, a color filter is arranged on the back surface of the substrate, and a microlens array is arranged on the color filter. The sensor further includes a pad region, and a buried pad arranged on the back surface and inside of the substrate. Moreover, within the photoelectric conversion region, a width of the second isolation region extending within the peripheral portion is greater than a width of the second isolation region extending within the central portion.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments of the inventive concept will be described in detail with reference to the accompanying drawings.

Figure 1:
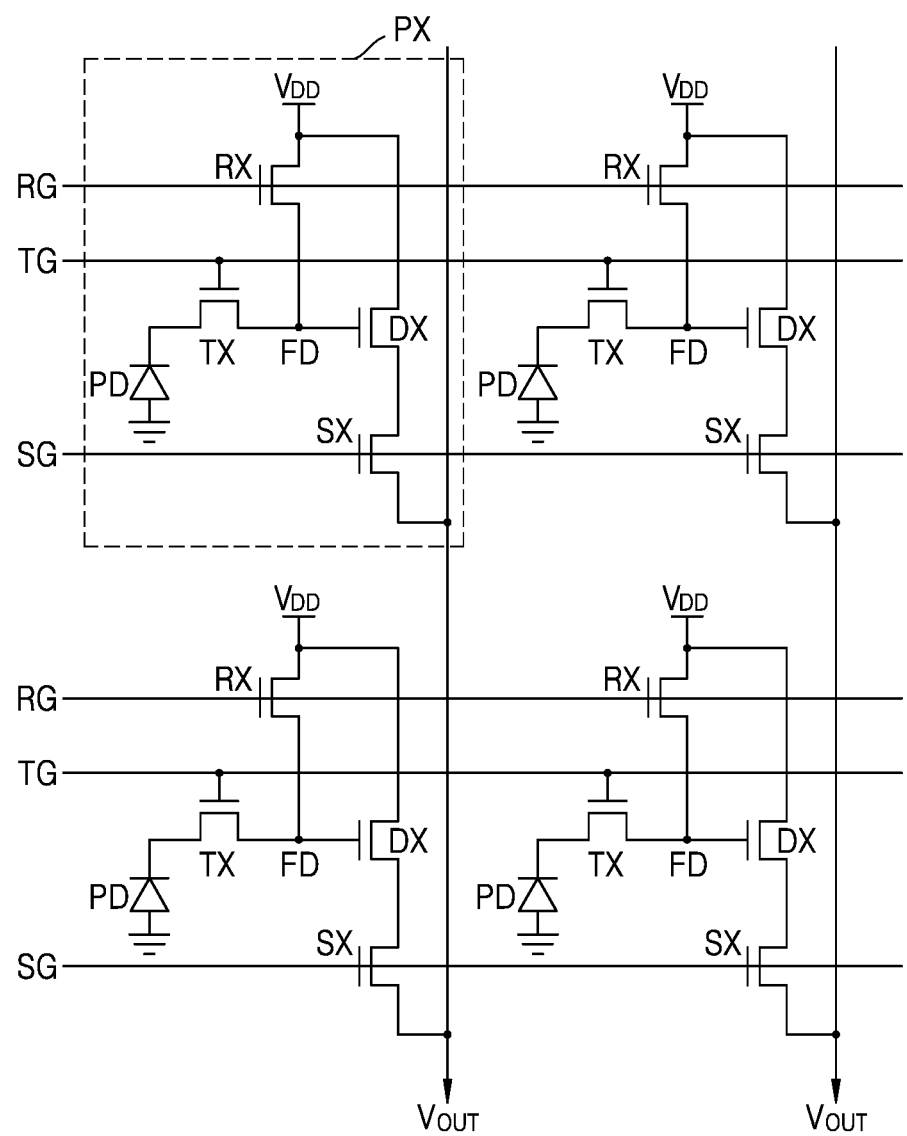
FIG. 1 is a circuit diagram of a pixel array of an image sensor according to an embodiment of the inventive concept.
Figure 2:
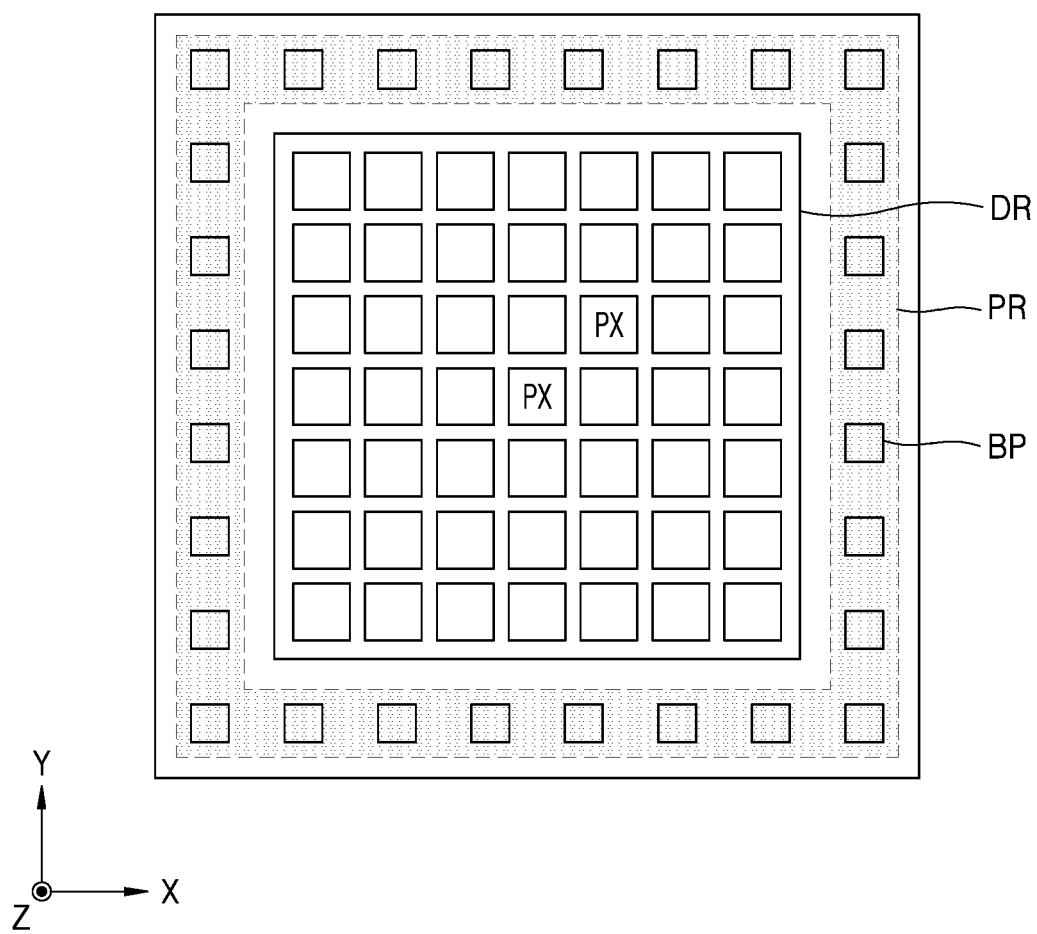
FIG. 2 is a plan view of a pixel array of an image sensor according to an embodiment of the inventive concept.

FIG. 1 is a circuit diagram of a pixel array of an image sensor according to an embodiment of the inventive concept, and FIG. 2 is a plan view of the pixel array. Referring to FIG. 1, a unit pixel PX including a transfer transistor TX and logic transistors (e.g., RX, SX, and DX) is shown in an array form. A plurality of unit pixels PX may be arranged. In some embodiments, the plurality of unit pixels PX may be arranged in a matrix form to thereby define a two-dimensional array of pixels. Herein, the logic transistors may include a reset transistor RX, a selection transistor SX, and a drive transistor DX (or a source follower transistor). The reset transistor RX may include a reset gate RG, and the selection transistor SX may include a selection gate SG. In addition, the transfer transistor TX may include a transfer gate TG.

The unit pixel PX may include a photoelectric conversion device PD and a floating diffusion region FD. The photoelectric conversion device PD may generate and accumulate photocharges in proportion to an amount of light incident thereon (e.g., from the outside). A photodiode, a phototransistor, a photogate, a pinned photodiode (PPD), or a combination thereof may be used as a photoelectric conversion device. The transfer gate TG may transfer photocharges generated by the photoelectric conversion device PD to the floating diffusion region FD. The floating diffusion region FD may receive and store (i.e., accumulate) the photocharges generated by the photoelectric conversion device PD. The drive transistor DX may be controlled according to an amount of photocharges accumulated in the floating diffusion region FD.

As will be understood by those skilled in the art, the reset transistor RX may periodically reset the photocharges accumulated in the floating diffusion region FD. A drain electrode of the reset transistor RX may be connected to the floating diffusion region FD, and a source electrode of the reset transistor RX may be connected to a power voltage $V_{DD}$. Thus, when the reset transistor RX is turned on, the power voltage $V_{DD}$ connected to the source electrode of the reset transistor RX may be transmitted to the floating diffusion region FD, and the charges accumulated in the floating diffusion region FD may be discharged (i.e., the floating diffusion region FD may be reset).

The drive transistor DX may be connected to a current source (not shown) positioned outside the unit pixel PX to function as a source follower buffer amplifier, and amplify a potential change in the floating diffusion region FD, and output the amplified potential change to an output line VOUT. The selection transistor SX may select the plurality of unit pixels PX in a unit of rows, and when the selection transistor SX is turned on, the power voltage $V_{DD}$ may be transmitted to a source electrode of the drive transistor DX.

Referring to FIG. 2, an image sensor 10 may include a device region DR in which the plurality of unit pixels PX are arranged, and a pad region PR including a peripheral circuit, which surrounds the device region DR. In the image sensor 10, the plurality of unit pixels PX may be arranged in a matrix form. The plurality of unit pixels PX may each include logic transistors. Referring to FIG. 1 together, the logic transistors may include the reset transistor RX, the selection transistor SX, and the drive transistor DX. The reset transistor RX may include the reset gate RG, the selection transistor SX may include the selection gate SG, and the transfer transistor TX may include the transfer gate TG. In addition, each of the plurality of unit pixels PX may include a corresponding photoelectric conversion device PD and corresponding floating diffusion region FD. The photoelectric conversion device PD may generate and accumulate photocharges in proportion to an amount of light incident from the outside.

The pad region PR is shown to entirely surround the device region DR, but such a layout of the image sensor 10 is merely exemplary, and various modifications are possible within the scope of the inventive concept. The plurality of unit pixels PX may be arranged in rows and columns in the device region DR. In addition, the pad region PR may include a buried pad BP electrically connected to the plurality of unit pixels PX and the peripheral circuit, and the buried pad BP may function as a connection terminal that provides power and a signal from the outside to a circuit included in the plurality of unit pixels PX and the peripheral circuit.

The image sensor 10 may include characteristics of image sensors 100, 200, and 300, which will be described below. That is, the image sensor 10 according to the inventive concept may provide a clear image signal by having a structure in which electrical characteristics thereof are improved by completely insulating a backside contact array (BCA) from a photoelectric conversion region.

Figure 3:
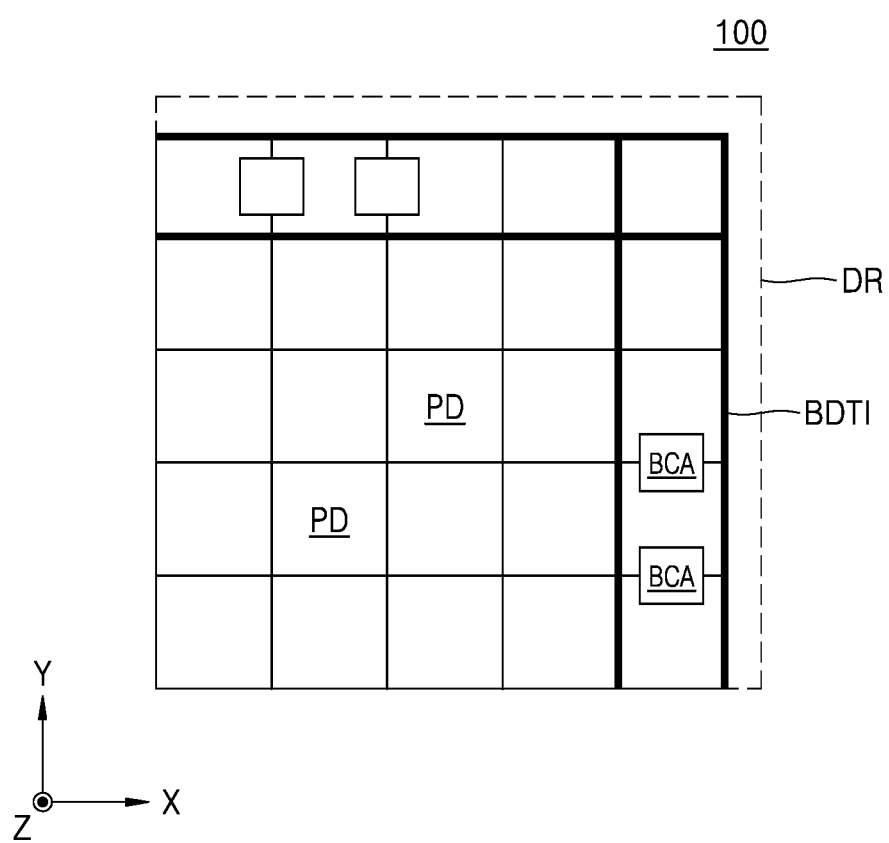
FIG. 3 is a schematic plan view of an image sensor according to an embodiment of the inventive concept.
Figure 4:
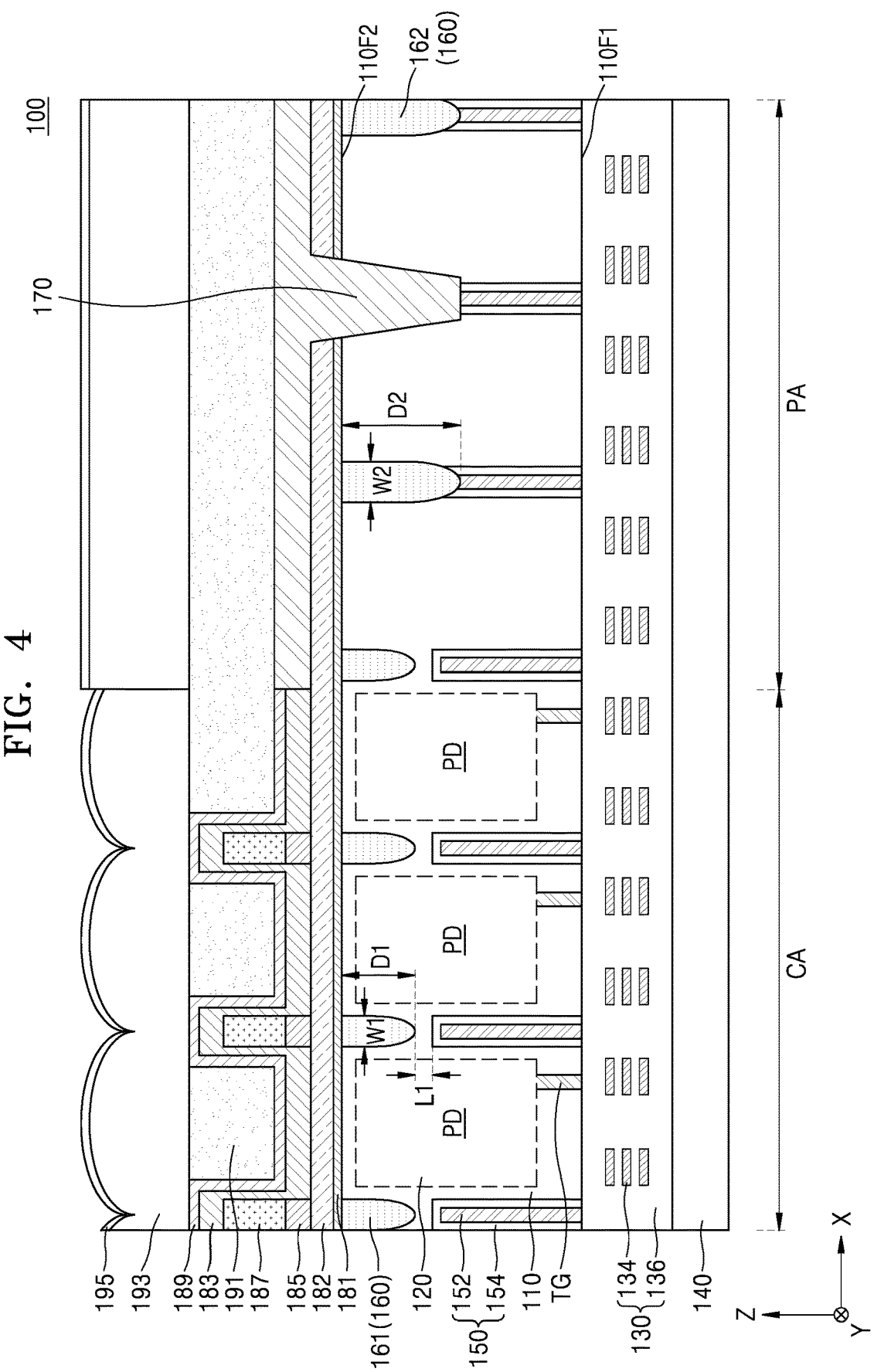
FIG. 4 is a cross-sectional view of an image sensor according to an embodiment of the inventive concept.

FIG. 3 is a schematic plan view of the image sensor according to an embodiment of the inventive concept, and FIG. 4 is a cross-sectional view of the image sensor. In particular, FIGS. 3 and 4 illustrate only a portion corresponding to the upper right end of the image sensor, for convenience of explanation. Referring to FIGS. 3 and 4, the image sensor 100 may include a substrate 110, a photoelectric conversion region 120, a front-side structure 130, a support substrate 140, a first isolation region 150, a second isolation region 160 (including second isolation regions 161 and 162), a contact region 170, first to third anti-reflection layers 181, 182, and 183, a color filter 191, a microlens 193, and a capping layer 195.

The substrate 110 may include a first surface 110F1 and a second surface 110F2, which face each other. In some embodiments, the substrate 110 may include a group IV semiconductor material, a group III-V semiconductor material, or a group II-VI semiconductor material. The group IV semiconductor material may include, for example, silicon (Si), germanium (Ge), or silicon germanium (SiGe). The group III-V semiconductor material may include, for example, gallium arsenide (GaAs), indium phosphate (InP), gallium phosphate (GaP), indium arsenide (InAs), indium antimony (InSb), or indium gallium arsenide (InGaAs). The group II-VI semiconductor material may include, for example, zinc telluride (ZnTe) or cadmium sulfide (CdS).

The substrate 110 may include a semiconductor substrate, such as a p-type silicon substrate. For example, in some embodiments, the substrate 110 may include a p-type bulk substrate and a p-type or n-type epitaxial layer grown thereon. In some other embodiments, the substrate 110 may include an n-type bulk substrate and a p-type or n-type epitaxial layer grown thereon. Alternatively, the substrate 110 may include an organic plastic substrate in some embodiments.

The photoelectric conversion region 120 may be arranged in the substrate 110. The photoelectric conversion region 120 may convert an optical signal into an electrical signal. The photoelectric conversion region 120 may include the photoelectric conversion device PD formed inside the substrate 110. The photoelectric conversion region 120 may be an impurity region doped with conductive impurities, which is opposite to the substrate 110. The photoelectric conversion region 120 may be divided into a central portion CA in which the photoelectric conversion devices PD are arranged, and a peripheral portion PA in which the photoelectric conversion devices PD are not arranged. Each photoelectric conversion device PD may generate and accumulate photocharges in proportion to an amount of light incident from the outside, and a photodiode, a phototransistor, a photogate, a PPD, or a combination thereof may be used.

The transfer gate TG may be arranged in the substrate 110. The transfer gate TG may extend into the substrate 110 from the first surface 110F1 of the substrate 110. The transfer gate TG may be a portion of a transfer transistor (TX, see FIG. 1). For example, the transfer transistor (TX, see FIG. 1) configured to transfer photocharges generated in the photoelectric conversion region 120 to a floating diffusion region (FD, see FIG. 1), a reset transistor (RX, see FIG. 1) configured to periodically reset photocharges stored in the floating diffusion region (FD, see FIG. 1), a drive transistor (DX, see FIG. 1) that serves as a source follower buffer amplifier and is configured to buffer a signal according to a charge charged in the floating diffusion region, and a selection transistor (SX, see FIG. 1) that serves as switching and addressing for selecting a plurality of unit pixels (PX, see FIG. 1) may be formed on the first surface 110F1 of the substrate 110.

The photoelectric conversion region 120, the transfer gate TG, a plurality of transistors, and a floating diffusion region may form a unit pixel (PX, see FIG. 1). The plurality of unit pixels (PX, see FIG. 1) may be adjacent to each other and may be two-dimensionally arranged. The plurality of unit pixels (PX, see FIG. 1) may be divided into an active pixel including the photoelectric conversion device PD and a dummy pixel not including the photoelectric conversion device PD.

In some embodiments, a pixel array including the plurality of unit pixels (PX, see FIG. 1) may be formed such that one of a width and a height is greater than the other one. For example, when the width of the pixel array is greater than the height thereof, the number of backside contact arrays BCA aligned horizontally may be greater than the number of backside contact arrays BCA aligned vertically, or a distance between the backside contact arrays BCA aligned horizontally may be greater than a distance between the backside contact arrays BCA aligned vertically.

The front-side structure 130 may be arranged on the first surface 110F1 of the substrate 110. The front-side structure 130 may include a wiring layer 134 and an insulating layer 136. The insulating layer 136 may be electrically isolated from a wiring layer 134 on the first surface 110F1 of the substrate 110. The wiring layer 134 may be electrically connected to a transistor on the first surface 110F1 of the substrate 110. The wiring layer 134 may include tungsten, aluminum, copper, tungsten silicide, titanium silicide, tungsten nitride, titanium nitride, doped polysilicon, or the like. The insulating layer 136 may include an insulating material such as silicon oxide, silicon nitride, silicon oxynitride, a low-k material, or the like. Optionally, the support substrate 140 may be arranged on the front-side structure 130. An adhesive member (not shown) may be further arranged between the support substrate 140 and the front-side structure 130.

The first isolation region 150 may extend in a vertical direction (Z direction) from the first surface 110F1 of the substrate 110, and physically and electrically isolate one photoelectric conversion device PD from an adjacent photoelectric conversion device PD. In a plan view, the first isolation region 150 may be arranged in a lattice form such as a mesh or grid shape. That is, the first isolation region 150 may extend between photoelectric conversion regions 120.

The first isolation region 150 may include a conductive layer 152 and an insulating liner 154 surrounding the conductive layer 152. Each of the conductive layer 152 and the insulating liner 154 may be formed inside the substrate 110 in the vertical direction (Z direction) from the first surface 110F1 of the substrate 110. The insulating liner 154 may be conformally arranged between the substrate 110 and the conductive layer 152 and electrically isolate the conductive layer 152 from the substrate 110. In some embodiments, the conductive layer 152 may include a conductive material such as polysilicon or metal. The insulating liner 154 may include a metal oxide such as hafnium oxide, aluminum oxide, tantalum oxide, or the like, and in this case, the insulating liner 154 may act as a negative (−) fixed charge layer. According to another embodiment, the insulating liner 154 may include an insulating material such as silicon oxide, silicon nitride, silicon oxynitride, or the like.

The second isolation region 160 may extend in the vertical direction (Z direction) from the second surface 110F2 of the substrate 110, and physically and electrically isolate one photoelectric conversion device PD from an adjacent photoelectric conversion device PD. In a plan view, the second isolation region 160 may be arranged in a lattice form such as a mesh or grid shape. That is, the second isolation region 160 may extend between the photoelectric conversion regions 120. In some embodiments, the second isolation region 160 may include an insulating material film such as silicon oxide, silicon nitride, silicon oxynitride, a low-k material, or the like. The insulating material film may be formed in a trench of a deep trench isolation (DTI) pattern. Details of the second isolation region 160 will be described below.

The contact region 170 may be formed to be electrically connected to the first isolation region 150 in the vertical direction (Z direction) from the second surface 110F2 of the substrate 110 (in the peripheral portion PA). This contact region 170 may include a metal material such as tungsten, and may be advantageously formed to contact a portion of the first isolation region 150, such that an electrical path may be provided from the power voltage ($V_{DD}$, see FIG. 1) to the conductive layer 152 (e.g., conductive grid/mesh) within the first isolation region 150. As shown, a lowermost surface of the contact region 170 may be formed to contact the conductive layer 152 of the first isolation region 150. In the contact region 170, a plurality of contacts may form a contact array, and the contact array may be formed in a dummy pixel, which is an area in which the photoelectric conversion device PD is not arranged.

As described above, the photoelectric conversion region 120 may be divided into the central portion CA in which the photoelectric conversion devices PD are arranged (as an array) and essential, and a peripheral portion PA in which the photoelectric conversion devices PD are not arranged. As shown by FIG. 4, a first width W1 of the second isolation region 161 arranged in the central portion CA of photoelectric conversion region 120 may be less than a second width W2 of the second isolation region 162 arranged in the peripheral portion PA of the photoelectric conversion region 120. In addition, a first depth D1 of the second isolation region 161 arranged in the central portion CA may be less than a second depth D2 of the second isolation region 162 arranged in the peripheral portion PA. Accordingly, the second isolation region 161 arranged in the central portion CA may be arranged to be spaced apart from the first isolation region 150 in the vertical direction (Z direction) by a first distance L1. The first distance L1 may be about 0.1 um to about 0.3 um in some embodiments, but is not limited thereto. The second isolation region 162 arranged in the peripheral portion PA may be sufficiently deep to thereby contact the opposing first isolation region 150. The second isolation region 161 arranged in the central portion CA and the second isolation region 162 arranged in the peripheral portion PA may only differ from each other in size, and the materials that form them may be substantially the same as each other.

When viewed in a cross-section, the second isolation region 162 contacting the first isolation region 150 may be arranged on both left and right sides of the contact region 170. That is, the second isolation region 162 contacting the first isolation region 150 may be formed in two or more lines. When viewed in a plan view, the contact region 170 may be enclosed by being surrounded by the second isolation region 162 contacting the first isolation region 150.

A first anti-reflection layer 181 may be arranged on the second surface 110F2 of the substrate 110. That is, the first anti-reflection layer 181 may be arranged on all the photoelectric conversion devices PD and the second isolation region 160. In some embodiments, the first anti-reflection layer 181 may include aluminum oxide, but is not limited thereto. In addition, a second anti-reflection layer 182 may be arranged on the first anti-reflection layer 181. That is, the second anti-reflection layer 182 may be arranged on all the photoelectric conversion devices PD and the second isolation region 160. In some embodiments, the second anti-reflection layer 182 may include hafnium oxide, but is not limited thereto.

A barrier metal layer 185 and a fence 187 may be arranged on the second anti-reflection layer 182. In some embodiments, the barrier metal layer 185 may include a barrier metal such as titanium nitride. In a plan view, the fence 187 may overlap (and be vertically aligned) with the first isolation region 150 and the second isolation region 160. That is, in a plan view, the fence 187 may extend between the photoelectric conversion devices PD. In some embodiments, the fence 187 may include a low-refractive-index material. When the fence 187 includes a low-refractive-index material having a relatively low refractive index, light incident toward the fence 187 may be totally reflected and directed toward a central portion of the photoelectric conversion device PD. Advantageously, the fence 187 may prevent light incident obliquely into the color filter 191 arranged on one photoelectric conversion device PD from entering the color filter 191 arranged on the adjacent photoelectric conversion device PD, and thus, crosstalk between the plurality of unit pixels PX may be significantly reduced or prevented.

The third anti-reflection layer 183 may be arranged on the second anti-reflection layer 182 and the fence 187. That is, the third anti-reflection layer 183 may cover the second anti-reflection layer 182 and the fence 187. In particular, the third anti-reflection layer 183 may be arranged on an upper surface of the second anti-reflection layer 182, a side surface of the fence 187, and an upper surface of the fence 187. In some embodiments, the third anti-reflection layer 183 may include silicon oxide, but is not limited thereto.

A passivation layer 189 may be arranged on the third anti-reflection layer 183. The passivation layer 189 may protect the third anti-reflection layer 183, the second anti-reflection layer 182, and the fence 187. In some embodiments, the passivation layer 189 may include aluminum oxide.

A plurality of color filters 191 may be arranged on the passivation layer 189 and may be separated from each other by the fence 187. The plurality of color filters 191 may be, for example, a combination of green, blue, and red, which are arranged in a predetermined pattern (e.g., Bayer pattern). In some other embodiments, the plurality of color filters 191 may be, for example, a combination of cyan, magenta, and yellow.

The microlens 193 may be arranged on the color filter 191 and the passivation layer 189. The microlens 193 may be arranged to correspond to the photoelectric conversion device PD. The microlens 193 may be transparent. For example, the microlens 193 may have a transmittance of 90% or more with respect to light in a visible light region. The microlens 193 may include, for example, a material such as a styrene-based resin, an acrylic resin, a styrene-acrylic copolymer-based resin, a siloxane-based resin, or the like. The microlens 193 may collect incident light, and the collected light may be incident on the photoelectric conversion region 120 through the color filter 191. The capping layer 195 may be arranged on the microlens 193.

Generally, backside deep trench isolation BDTI configured to insulate the unit pixel PX from the backside contact array BCA is formed in substantially the same size in the central portion CA and the peripheral portion PA of the photoelectric conversion region 120. In this case, due to a margin difference in manufacturing, the depth of a portion of the backside deep trench isolation BDTI may be formed smaller than the design in the peripheral portion PA of the photoelectric conversion region 120. Accordingly, leakage current generated in the backside contact array BCA may be leaked to a lower portion of the backside deep trench isolation BDTI, and thus, the electrical characteristics of the image sensor 100 may be damaged, and an operation of the image sensor 100 may be deteriorated or prevented.

To solve the above problem, in the image sensor 100, the first width W1 of the second isolation region 161 arranged in the central portion CA of the photoelectric conversion region 120 and the second width W2 of the second isolation region 162 arranged in the peripheral portion PA of the photoelectric conversion region 120 are designed to be different from each other such that the backside contact array BCA may be completely insulated from the photoelectric conversion region 120. Accordingly, even when a manufacturing margin occurs, the backside contact array BCA may be completely insulated to prevent leakage current from leaking to a lower portion of the second isolation region 160 in advance.

In addition, the image sensor 100 according to the inventive concept enables manufacturing operations of the second isolation regions 161 and 162, which have different sizes from each other, in a single photomask operation, and thus, the image sensor 100 having a structure with improved electrical characteristics may be obtained even without an increase in manufacturing cost. Ultimately, the image sensor 100 according to the inventive concept has an effect that a clear image signal may be provided by having a structure with improved electrical characteristics without an increase in manufacturing cost.

FIGS. 5 to 8 are diagrams of image sensors according to another embodiment of the inventive concept. In particular, FIGS. 5 to 8 illustrate only a portion corresponding to the upper right end of the image sensors, for convenience of explanation.

Most of components forming image sensors 200 and 300 to be described below and materials forming the components are substantially the same as or similar to those described with reference to FIGS. 3 and 4 above. Accordingly, for convenience of explanation, a difference from the image sensor 100 described above will be mainly described.

Figure 5:
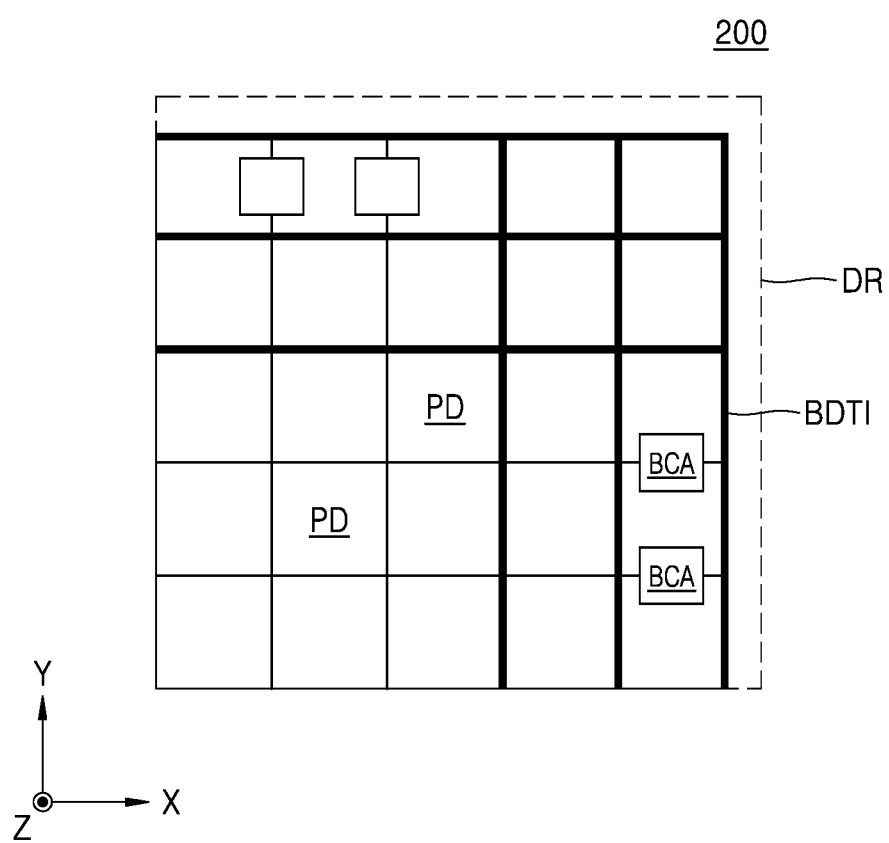
FIGS. 5 to 8 are diagrams of image sensors according to another embodiment of the inventive concept.
Figure 6:
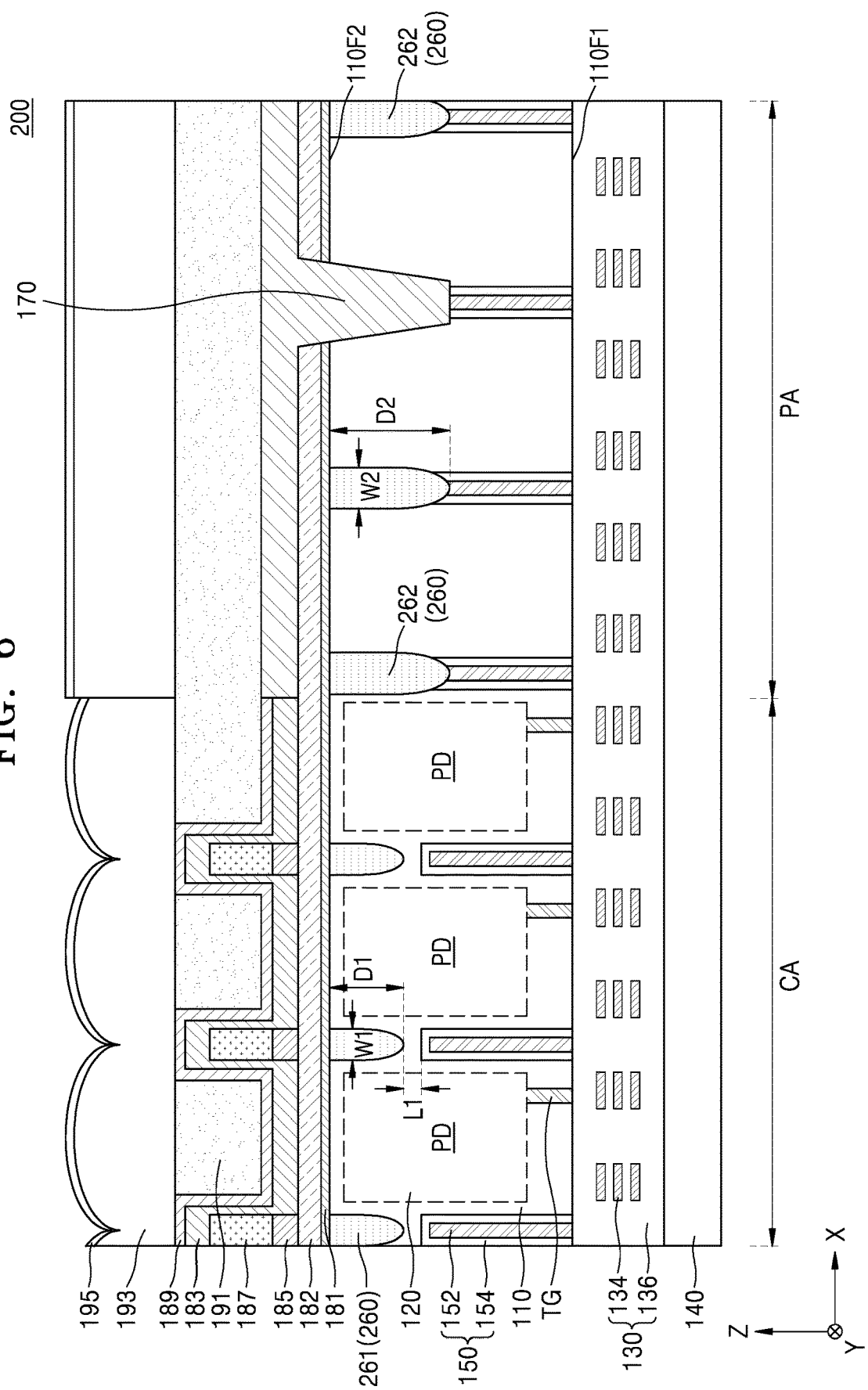

Referring to FIGS. 5 and 6, the image sensor 200 may include the substrate 110, the photoelectric conversion region 120, the front-side structure 130, the support substrate 140, the first isolation region 150, a second isolation region 260 (including second isolation regions 261 and 262), the contact region 170, the first to third anti-reflection layers 181, 182, and 183, the color filter 191, the microlens 193, and the capping layer 195.

In the image sensor 200 of the present embodiment, the photoelectric conversion region 120 may be divided into the central portion CA in which the photoelectric conversion device PD is arranged, and the peripheral portion PA in which the photoelectric conversion device PD is not arranged. A first width W1 of the second isolation region 261 arranged in the central portion CA of the photoelectric conversion region 120 may be less than a second width W2 of the second isolation region 262 arranged in the peripheral portion PA of the photoelectric conversion region 120.

In addition, a first depth D1 of the second isolation region 261 arranged in the central portion CA may be less than a second depth D2 of the second isolation region 262 arranged in the peripheral portion PA. Accordingly, the second isolation region 261 arranged in the central portion CA may be arranged to be apart from the first isolation region 150 in the vertical direction (Z direction) by a first distance L1. The first distance L1 may be about 0.1 um to about 0.3 um, but is not limited thereto. The second isolation region 262 arranged in the peripheral portion PA may be arranged to contact the first isolation region 150.

The second isolation region 261 arranged in the central portion CA and the second isolation region 262 arranged in the peripheral portion PA are different from each other only in size, and materials forming them may be substantially the same as each other.

When viewed in a cross-section, the second isolation region 262 contacting the first isolation region 150 may be arranged on both left and right sides of the contact region 170. In addition, the second isolation region 262 contacting the first isolation region 150 may be formed in a plurality of lines on a side close to the central portion CA, which is a left side of the contact region 170. That is, the second isolation region 262 contacting the first isolation region 150 may be formed in three or more lines. When viewed in a plan view, the contact region 170 may be closed by being surrounded by the second isolation region 262 contacting the first isolation region 150.

Figure 7:
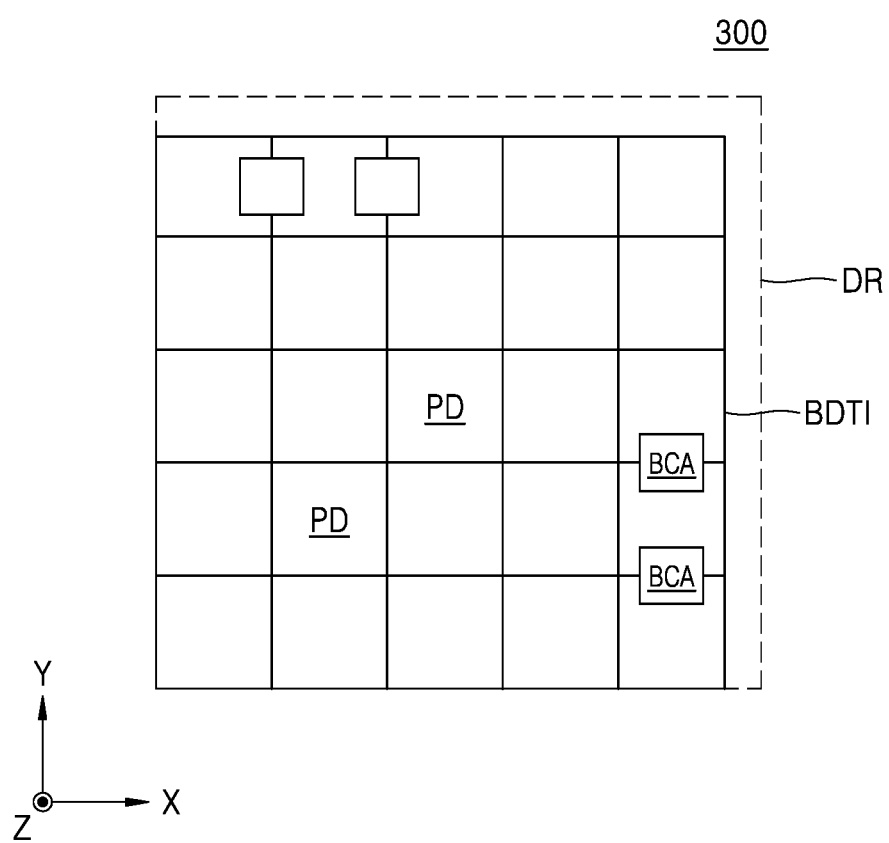
Figure 8:
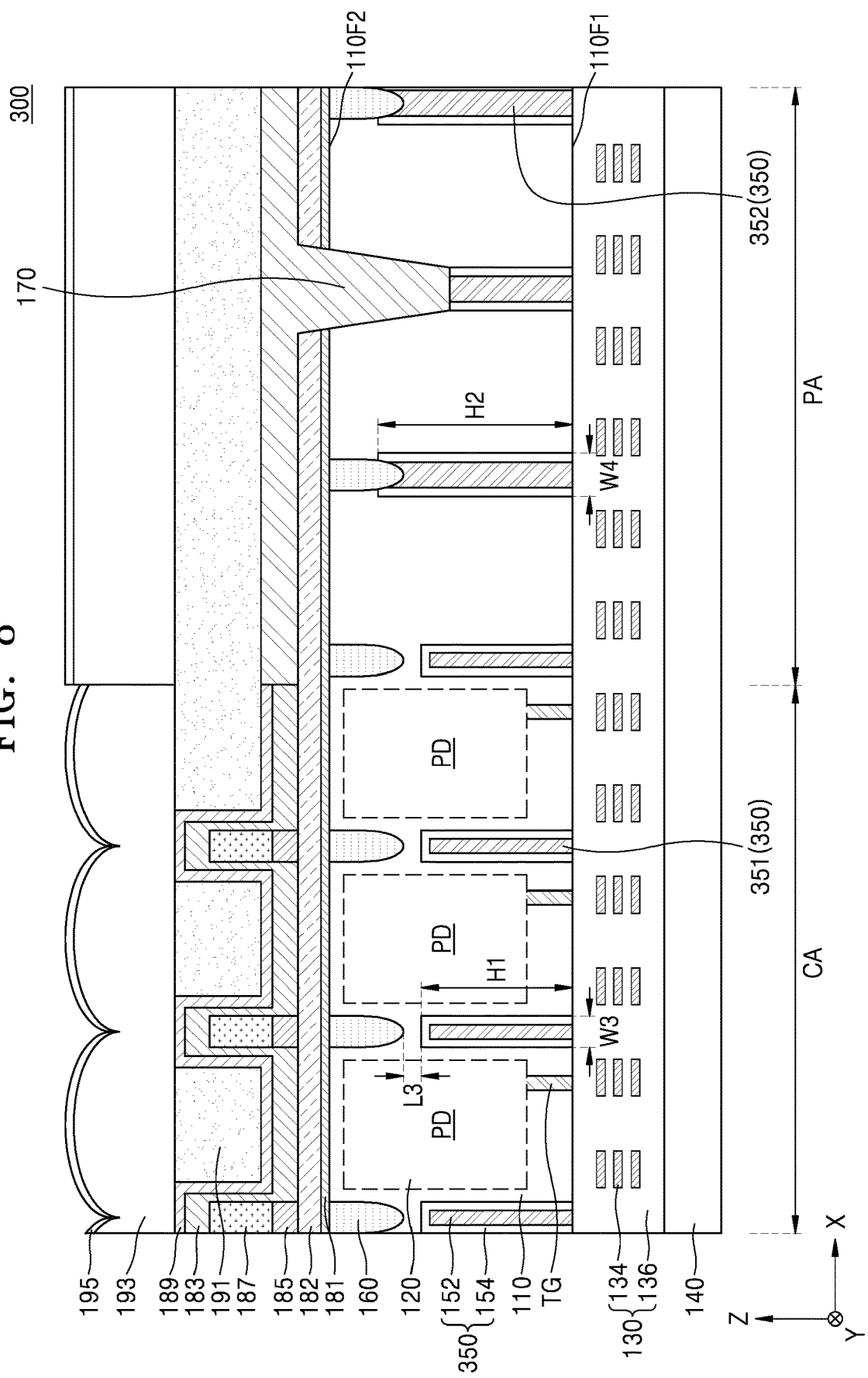

Referring to FIGS. 7 and 8, the image sensor 300 may include the substrate 110, the photoelectric conversion region 120, the front-side structure 130, the support substrate 140, a first isolation region 350 (including first isolation regions 351 and 352), the second isolation region 160, the contact region 170, the first to third anti-reflection layers 181, 182, and 183, the color filter 191, the microlens 193, and the capping layer 195.

In the image sensor 300 of the present embodiment, the photoelectric conversion region 120 may be divided into the central portion CA in which the photoelectric conversion device PD is arranged, and the peripheral portion PA in which the photoelectric conversion device PD is not arranged. A third width W3 of the first isolation region 351 arranged in the central portion CA of the photoelectric conversion region 120 may be less than a fourth width W4 of the first isolation region 352 arranged in the peripheral portion PA of the photoelectric conversion region 120.

In addition, a first height H1 of the first isolation region 351 arranged in the central portion CA may be less than a second height H2 of the first isolation region 352 arranged in the peripheral portion PA. Accordingly, the first isolation region 351 arranged in the central portion CA may be arranged to be apart from the second isolation region 160 in the vertical direction (Z direction) by a third distance L3. The third distance L3 may be about 0.1 um to about 0.3 um, but is not limited thereto. The first isolation region 352 arranged in the peripheral portion PA may be arranged to contact the second isolation region 160.

The first isolation region 351 arranged in the central portion CA and the first isolation region 352 arranged in the peripheral portion PA are different from each other only in size, and materials forming them may be substantially the same as each other.

When viewed in a cross-section, the first isolation region 352 contacting the second isolation region 160 may be arranged on both left and right sides of the contact region 170. That is, the first isolation region 352 contacting the second isolation region 160 may be formed in two or more lines. When viewed in a plan view, the contact region 170 may be closed by being surrounded by the second isolation region 160 and the first isolation region 352 contacting the second isolation region 160.

Figure 9:
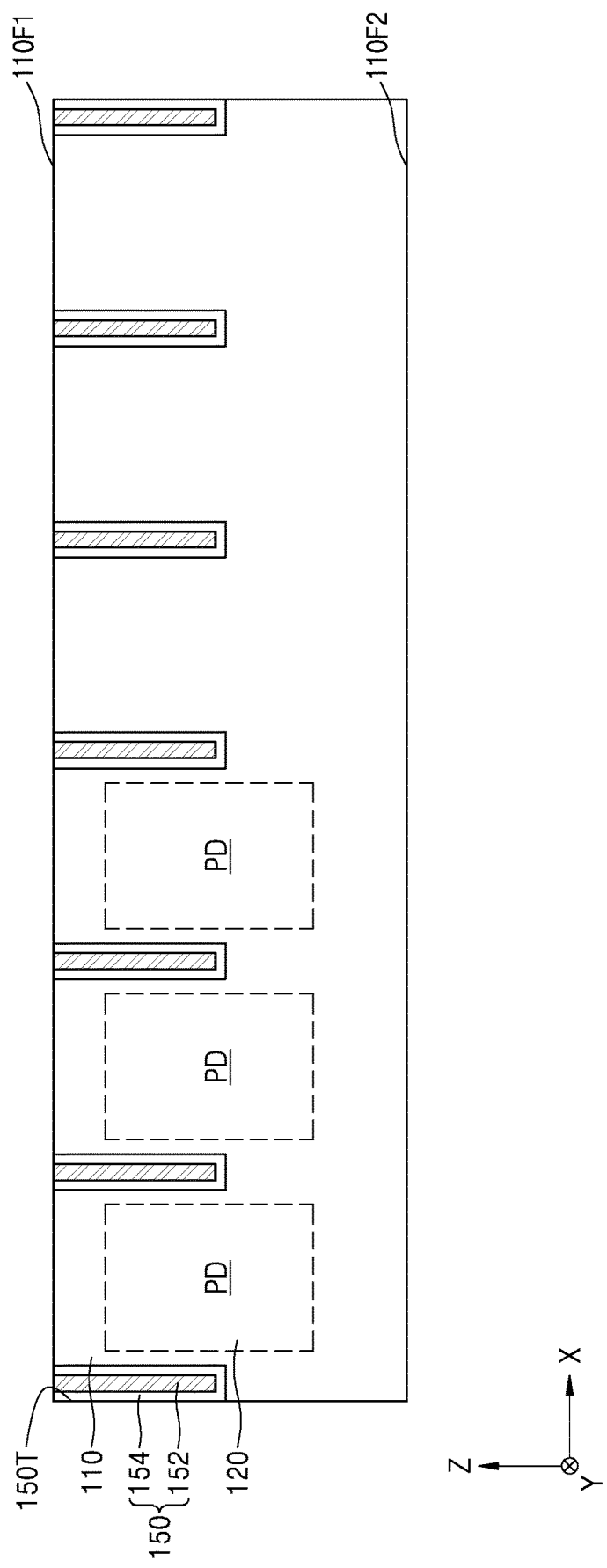
FIGS. 9 to 15 are cross-sectional views of intermediate structures that illustrate methods of manufacturing an image sensor according to embodiments of the inventive concept.

FIGS. 9 to 15 are cross-sectional views of a method of manufacturing an image sensor according to an embodiment of the inventive concept. Referring to FIG. 9, the substrate 110 having the first surface 110F1 and the second surface 110F2, which face each other, is prepared.

A mask pattern (not shown) may be formed on the first surface 110F1 of the substrate 110, and a first trench 150T may be formed by removing a portion of the substrate 110 from the first surface 110F1 of the substrate 110 by using the mask pattern as an etching mask. Next, the insulating liner 154 and the conductive layer 152 may be sequentially formed in the first trench 150T, and a portion of the insulating liner 154 and the conductive layer 152 arranged on the first surface 110F1 of the substrate 110 may be removed by a planarization operation to form the first isolation region 150 in the first trench 150T. Then, the photoelectric conversion region 120 including the photoelectric conversion device PD may be formed from the first surface 110F1 of the substrate 110 by an ion injection operation. For example, the photoelectric conversion device PD may be formed by doping an n-type impurity.

Figure 10:
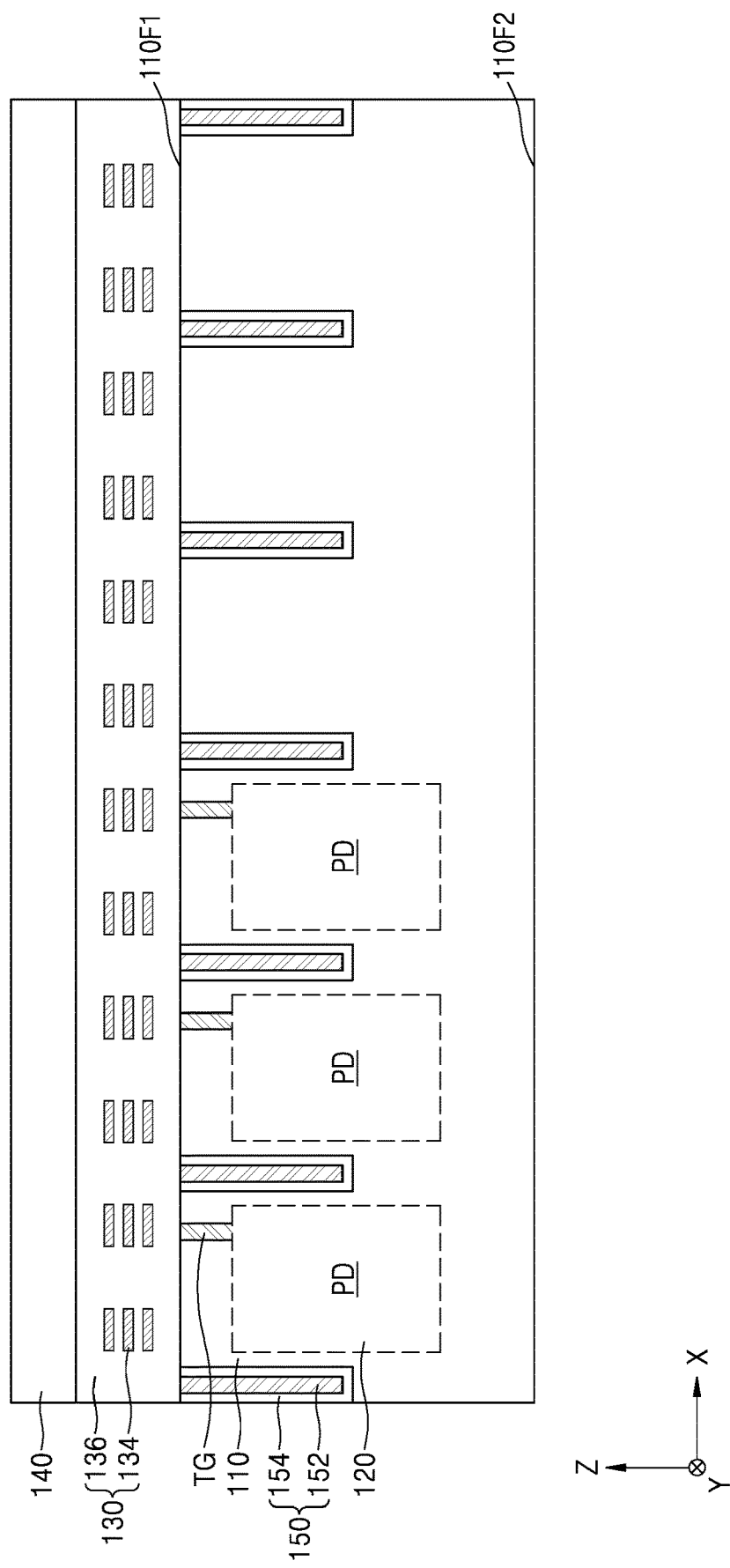

Referring to FIG. 10, the transfer gate TG extending from the first surface 110F1 of the substrate 110 to the inside of the substrate 110 may be formed. Next, the front-side structure 130 may be formed on the first surface 110F1 of the substrate 110. The wiring layer 134 and the insulating layer 136 may be formed on the substrate 110 by repeatedly performing an operation of forming a conductive layer on the first surface 110F1 of the substrate 110, patterning the conductive layer, and forming an insulating layer to cover the patterned conductive layer.

Figure 11:
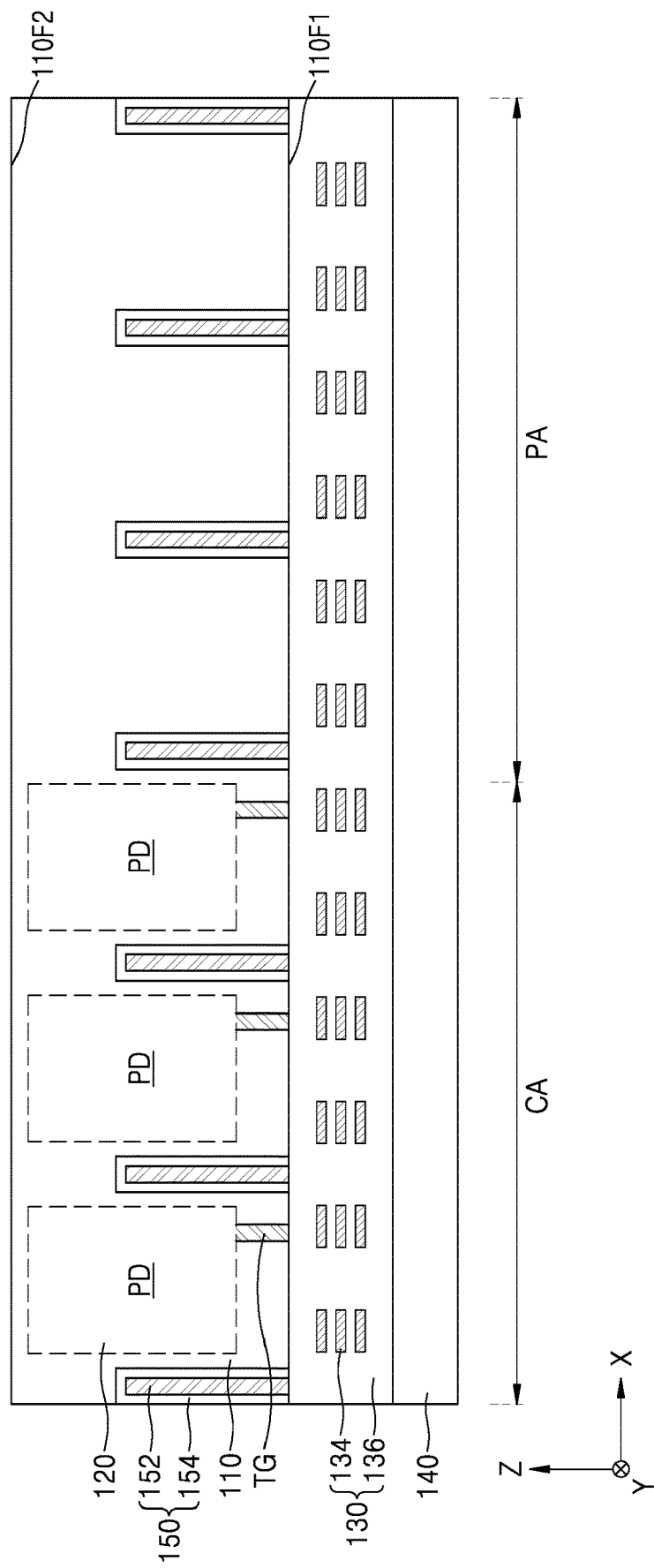

Then, optionally, the support substrate 140 may be adhered to the front-side structure 130 through an adhesive member (not shown). Referring to FIG. 11, the substrate 110 may be turned over so that the second surface 110F2 of the substrate 110 faces upward. Next, a portion of the substrate 110 may be removed from the second surface 110F2 of the substrate 110 by a planarization operation such as a chemical mechanical polishing operation or an etch-back operation. As the removal operation is performed, a level of the second surface 110F2 of the substrate 110 may be lowered.

Figure 12:
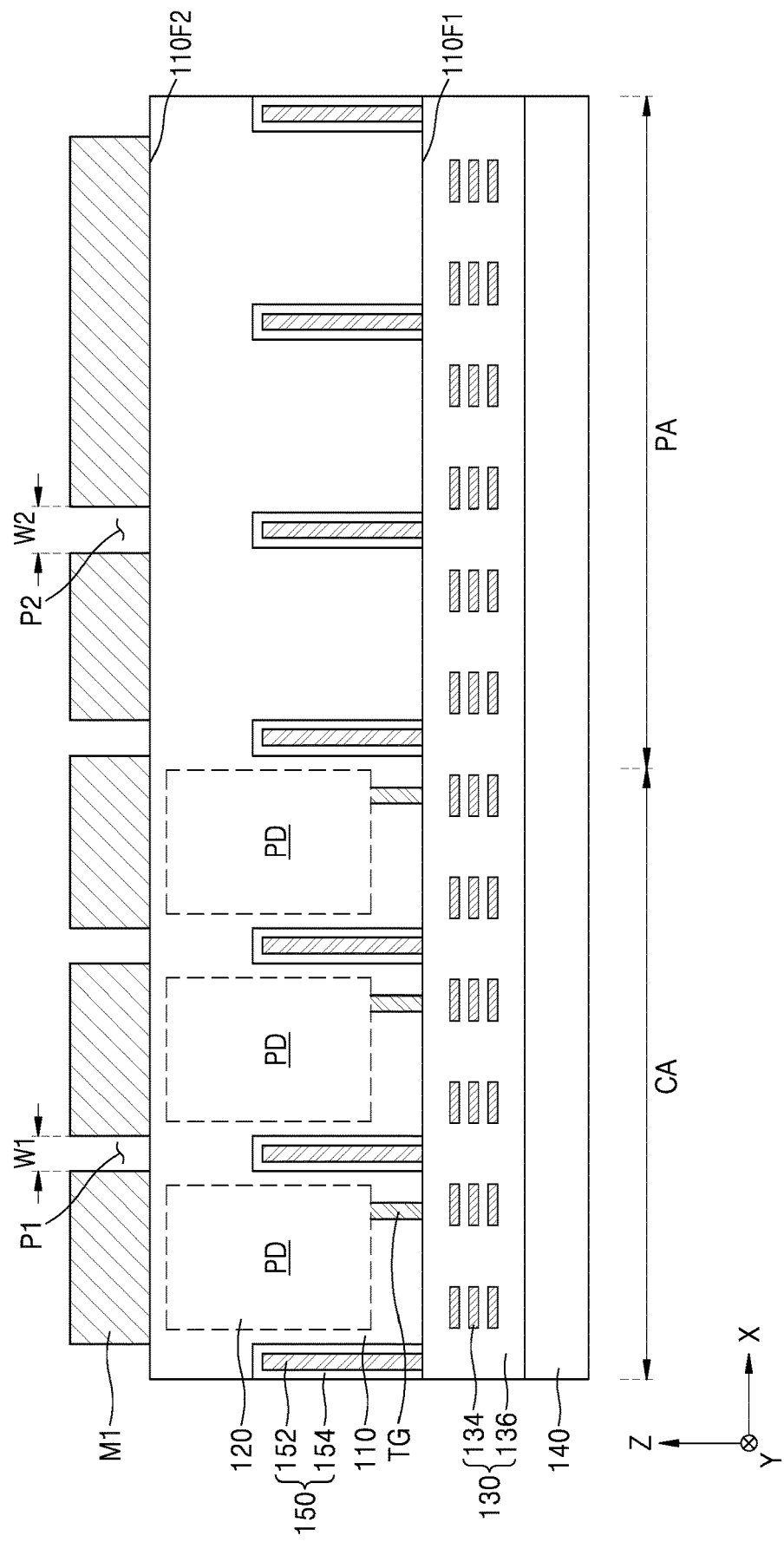

Referring to FIG. 12, a first mask pattern M1 may be formed on the second surface 110F2 of the substrate 110. The first mask pattern M1 is an etch mask configured to form a second trench (160T of FIG. 13) defining a second isolation region (160 of FIG. 4) inside the substrate 110, and may be formed by a photolithography operation. The photoelectric conversion region 120 may be divided into the central portion CA in which the photoelectric conversion device PD is arranged, and a peripheral portion PA in which the photoelectric conversion device PD is not arranged. In the first mask pattern M1, a first width W1 of a first opening P1 arranged in the central portion CA of the photoelectric conversion region 120 may be formed less than a second width W2 of a second opening P2 arranged in the peripheral portion PA of the photoelectric conversion region 120.

Figure 13:
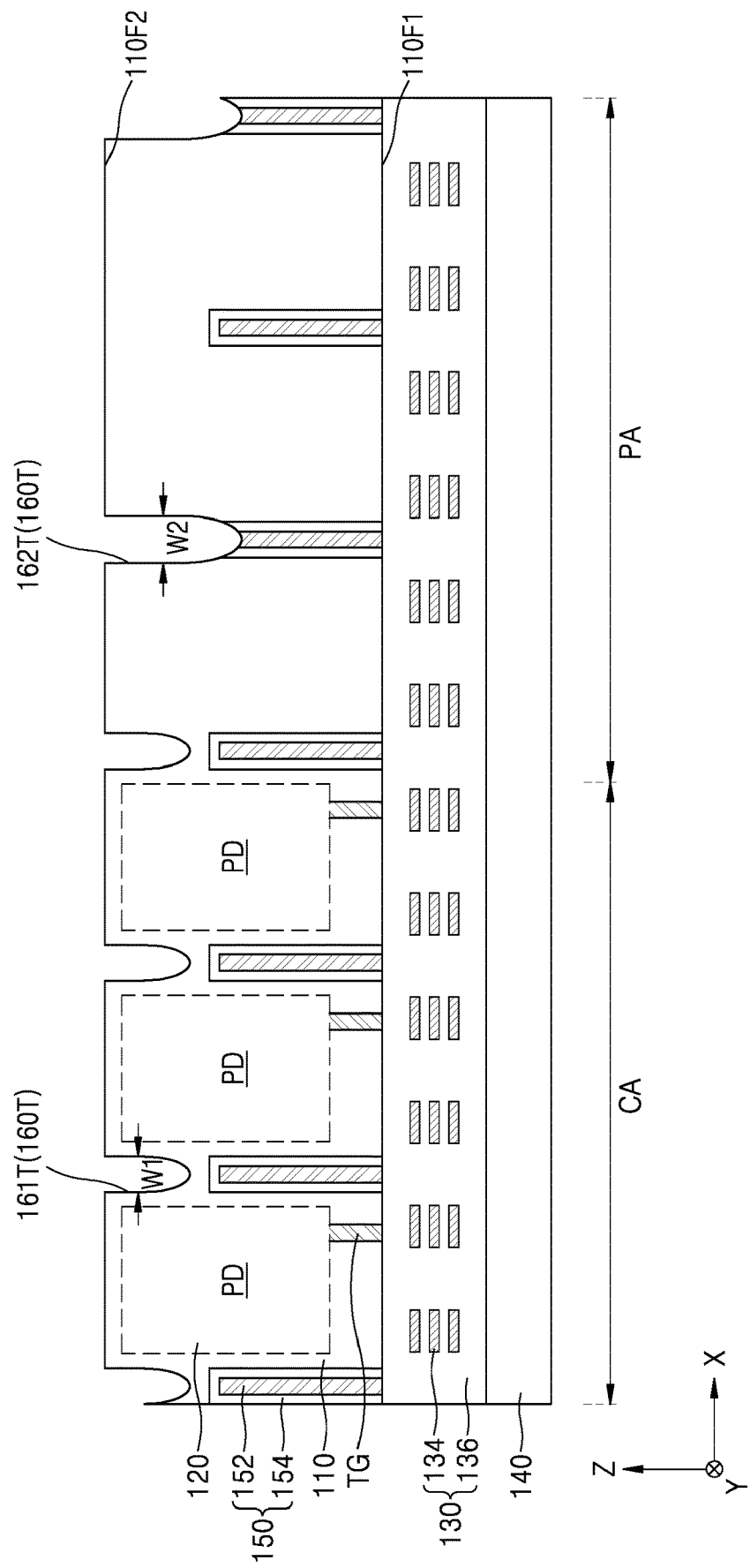

Referring to FIG. 13, the first mask pattern (M1 of FIG. 12) may be used as an etch mask to remove a portion of the substrate 110, thereby forming a second trench 160T (including second trenches 161T and 162T) in a vertical direction (Z direction) from the second surface 110F2 of the substrate 110. Next, the first mask pattern (M1 of FIG. 12) may be removed using an ashing or other stripping operation, for example.

A first width W1 of the second trench 161T arranged in the central portion CA of the photoelectric conversion region 120 may be less than a second width W2 of the second trench 162T arranged in the peripheral portion PA of the photoelectric conversion region 120. In addition, a first depth D1 of the second trench 161T arranged in the central portion CA of the photoelectric conversion region 120 may be less than a second depth D2 of the second trench 162T arranged in the peripheral portion PA of the photoelectric conversion region 120. This may be a characteristic resulting in an operation using the first mask pattern (M1 of FIG. 12), and accordingly, the second trenches 161T and 162T, which have different sizes from each other, may be formed in a single photomask operation.

Figure 14:
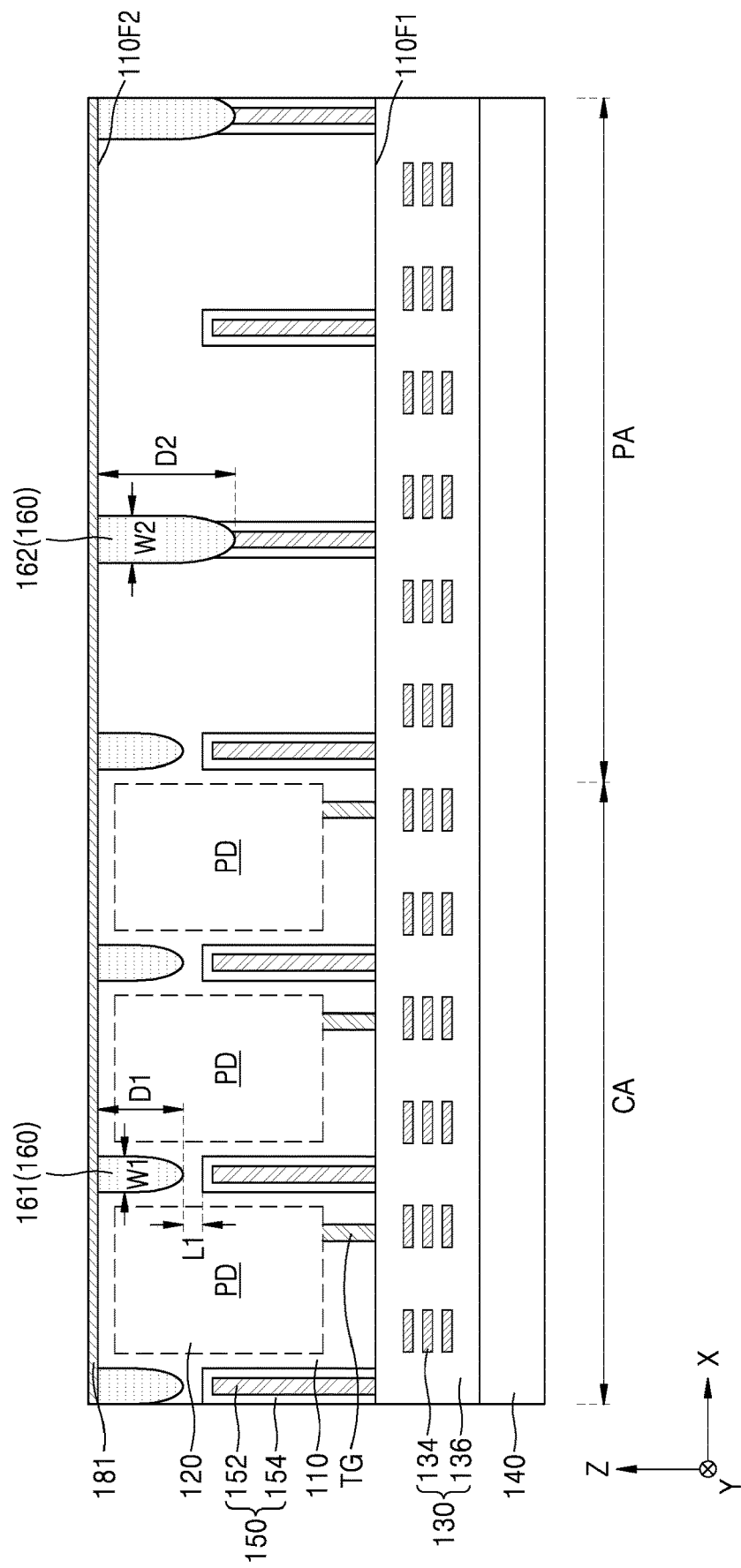

Referring to FIG. 14, the second isolation region 160 (including the second isolation regions 161 and 162) may be formed to fill the second trench (160T of FIG. 13) of the substrate 110. The second isolation region 161 arranged in the central portion CA of the photoelectric conversion region 120 and the second isolation region 162 arranged in the peripheral portion PA of the photoelectric conversion region 120 may differ only in size from each other, and materials forming them may be substantially the same as each other. Next, the first anti-reflection layer 181 may be formed on the second surface 110F2 of the substrate 110. The first anti-reflection layer 181 may include aluminum oxide, but is not limited thereto.

Figure 15:
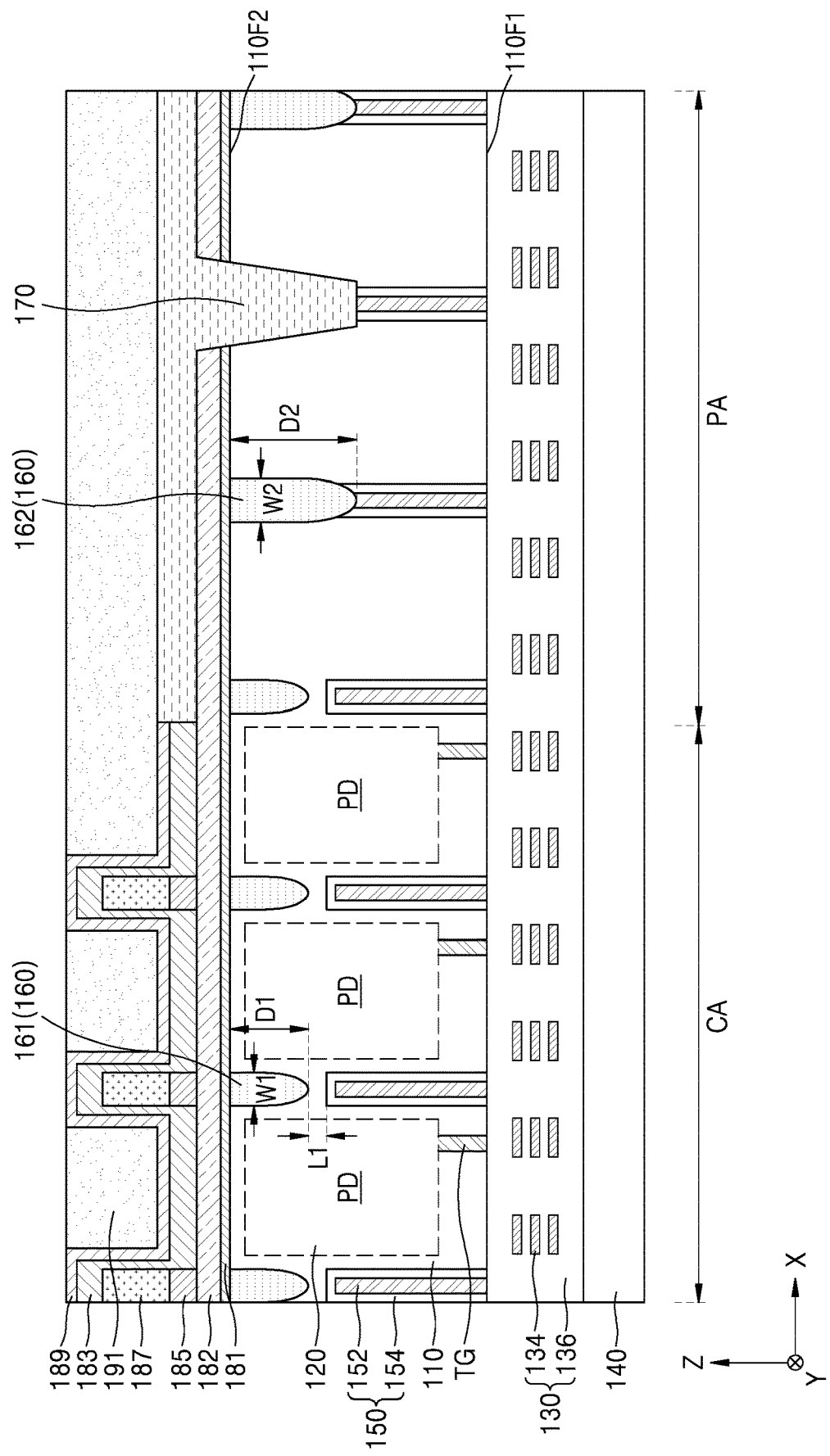

Referring to FIG. 15, the second anti-reflection layer 182 may be formed on the first anti-reflection layer 181. Then, the contact region 170 may be formed. The contact region 170 may be formed to be electrically connected to the first isolation region 150 in the vertical direction (Z direction) from the second surface 110F2 of the substrate 110. The contact region 170 may include a metal material such as tungsten. The contact region 170 may be formed to contact a portion of the first isolation region 150.

Then, the barrier metal layer 185 and the fence 187 may be formed on the second anti-reflection layer 182. In addition, the third anti-reflection layer 183 may be formed on the second anti-reflection layer 182 and the fence 187. In addition, the passivation layer 189 may be formed on the third anti-reflection layer 183. In addition, the color filters 191 may be formed on the passivation layer 189, and the color filters 191 may be separated from each other by the fence 187.

Referring again to FIG. 4, the microlens 193 may be formed on the color filters 191 and the passivation layer 189. Next, the capping layer 195 may be formed on the microlens 193. In this way, the image sensor 100 according to the inventive concept may be completed.

Figure 16:
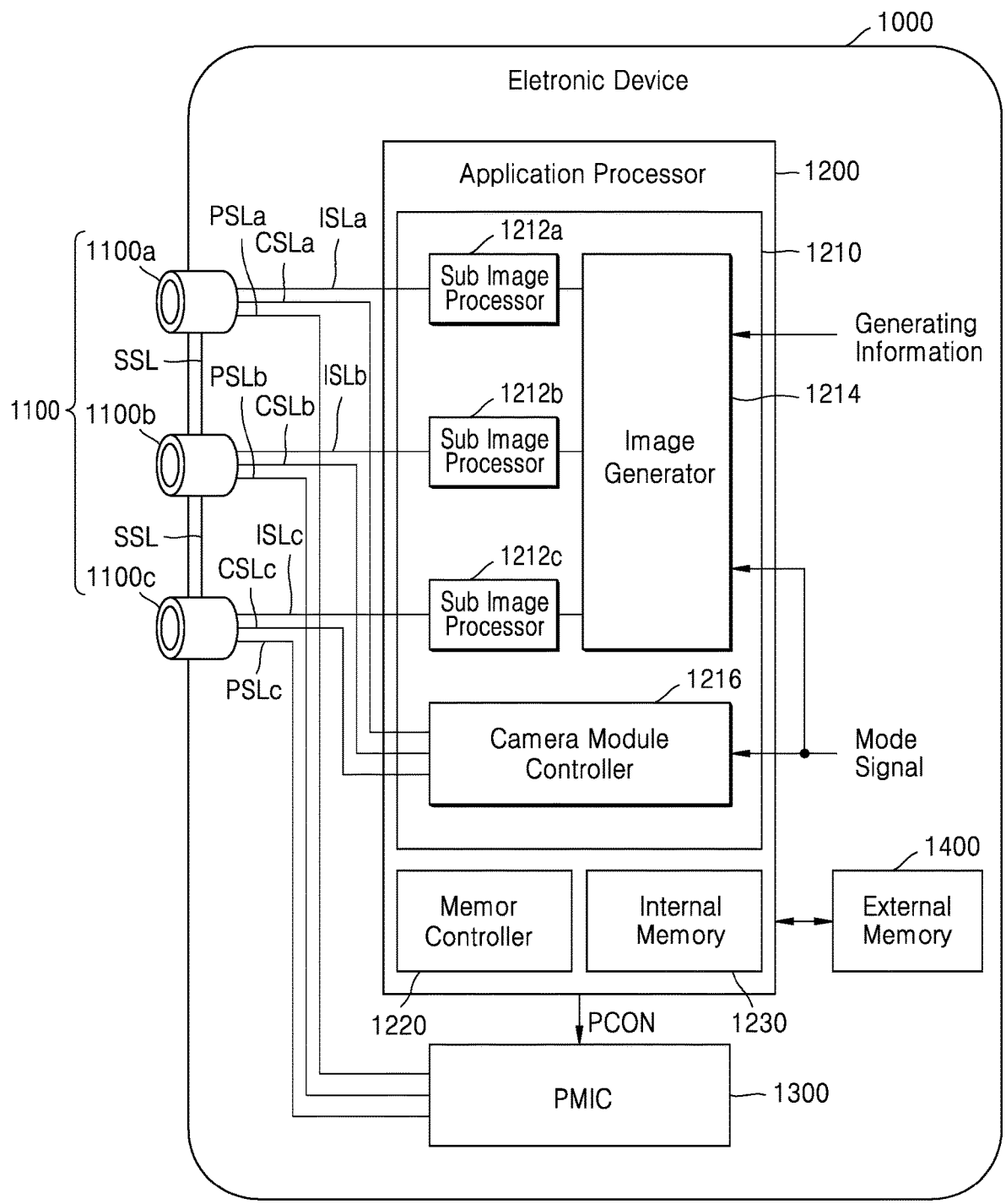
FIG. 16 is a block diagram of an electronic device including a multi-camera module.
Figure 17:
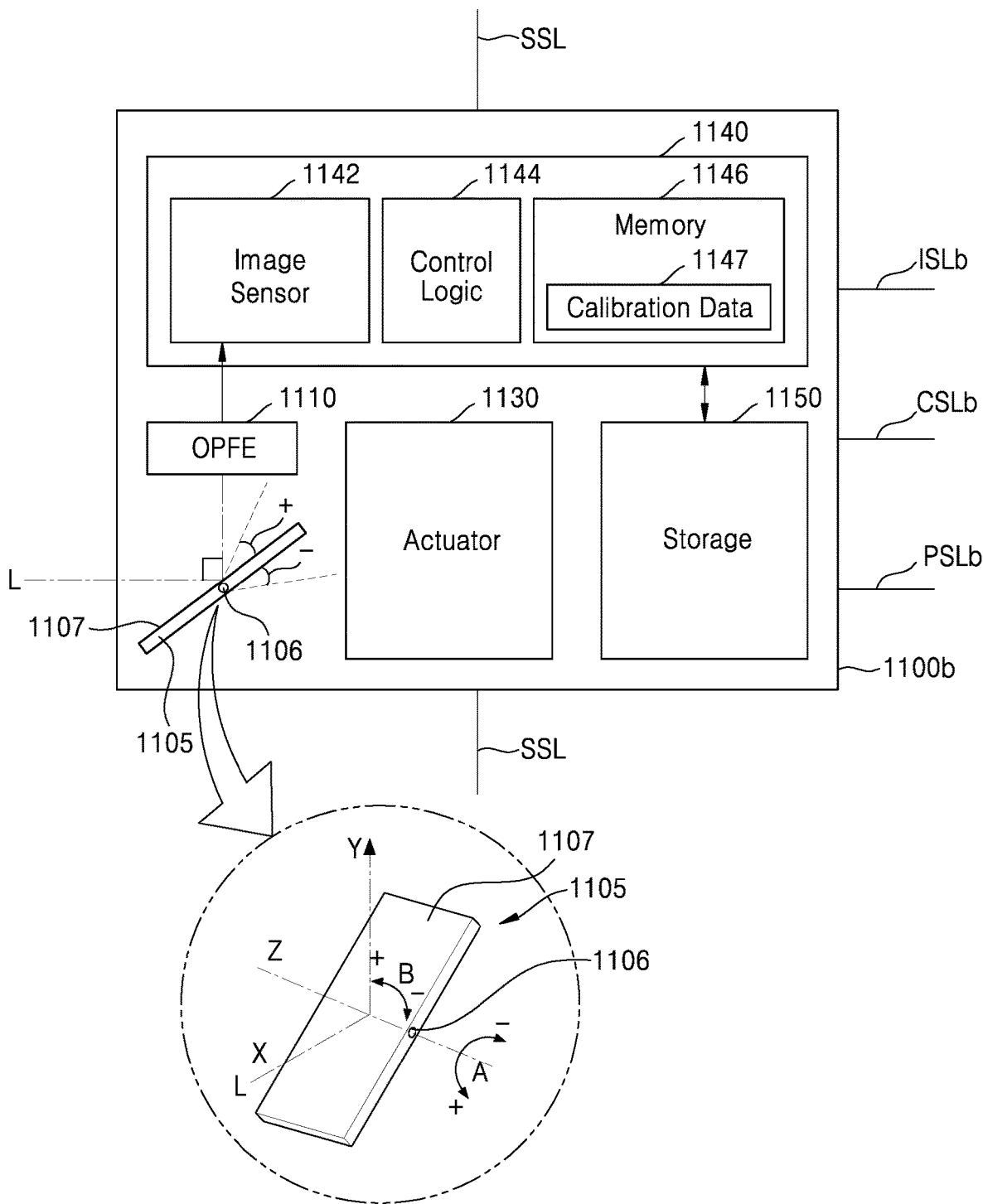
FIG. 17 is a detailed block diagram of the camera module of FIG. 16.

FIG. 16 is a block diagram of an electronic device including a multi-camera module, and FIG. 17 is a detailed block diagram of the camera module of FIG. 16. Referring to FIG. 16, the electronic device 1000 may include a camera module group 1100, an application processor 1200, a power management integrated circuit (PMIC), and an external memory 1400.

The camera module group 1100 may include a plurality of camera modules 1100a, 1100b, and 1100c. Although FIG. 16 shows an embodiment in which three camera modules 1100a, 1100b, and 1100c are arranged, the embodiments are not limited thereto. In some embodiments, the camera module group 1100 may be modified to include only two camera modules or n camera modules (herein, n is a natural number greater than or equal to 4).

Hereinafter, a configuration of the camera module 1100b will be described in more detail with reference to FIG. 17, but the following description may be equally applied to other camera modules 1100a and 1100c according to an example embodiment. Referring to FIG. 17, the camera module 1100b may include a prism 1105, an optical path folding element (OPFE) 1110, an actuator 1130, an image sensing device 1140, and a storage 1150. The prism 1105 may change a path of light L incident from the outside, including a reflective surface 1107 of a light reflective material.

In some embodiments, the prism 1105 may change the path of the light L incident in a first direction (X direction) to a second direction (Y direction) perpendicular to the first direction (X direction). In addition, the prism 1105 may change the path of the light L incident in the first direction (X direction) to the second direction (Y direction) perpendicular to the first direction (X direction) by rotating the reflective surface 1107 of the light reflective material around a central axis 1106 in an A-direction or rotating the central axis 1106 in a B-direction. In this case, the OPFE 1110 may move in a third direction (Z direction) perpendicular to the first direction (X direction) and the second direction (Y direction).

In some embodiments, as shown in FIG. 17, a maximum rotation angel of the prism 1105 in the A-direction may be 15° or less in a positive (+) A-direction and greater than 15° in a negative (−) A-direction, but embodiments are not limited thereto. In some other embodiments, the prism 1105 may move in a positive (+) or negative (−) B-direction around 20°, between 10° and 20°, or between 15° and 20°, and herein, the moving angle may move at the same angle in the positive (+) or negative (−) B-direction, or move to an almost similar angle within a range of 1°. In yet further embodiments, the prism 1105 may move the reflective surface 1107 of the light reflective material in the third direction (e.g., Z direction) parallel to an extension direction of the central axis 1106.

The OPFE 1110 may include, for example, m groups of optical lenses (here, m is natural number). The m groups of lenses may be moved in the second direction (Y direction) to change an optical zoom ratio of the camera module 1100b. For example, when a basic optical zoom ratio of the camera module 1100 is Z, and when the m groups of lens included in the OPFE 1100 are moved, the optical zoom ratio of the camera module 1100b may be changed to an optical zoom ratio of 3Z, 5Z, or greater than 5Z. The actuator 1130 may move the OPFE 1100 or an optical lens to a certain position. For example, for accurate sensing, the actuator 1130 may adjust a position of the optical lens such that an image sensor 2142 is positioned at a focal length of the optical lens.

The image sensing device 1140 may include the image sensor 1142, a control logic 1144, and a memory 1146. The image sensor 1142 may sense an image of a sensing target by using light L provided through an optical lens. The control logic 1144 may control an overall operation of the camera module 1100b. For example, the control logic 1144 may control an operation of the camera module 1100b according to a control signal provided through a control signal line CSLb.

The memory 1146 may store information, such as calibration data 1147, which is necessary to operate the camera module 1100b. The calibration data 1147 may include information necessary for the camera module 1100b to generate image data by using light L provided from the outside. The calibration data 1147 may include, for example, information regarding a degree of rotation, a focal length, an optical axis, or the like. When the camera module 1100b is implemented in the form of a multi-state camera in which a focal distance varies according to a position of the optical lens, the calibration data 1147 may include a focal distance value of each position (or each state) of the optical lens and information related to auto focusing.

The storage 1150 may store image data sensed through the image sensor 1142. The storage 1150 may be arranged outside the image sensing device 1140 and may be stacked together with a sensor chip forming the image sensing device 1140. In some embodiments, the storage 1150 may be implemented as an electrically erasable programmable read-only memory (EEPROM), but embodiments are not limited thereto.

Referring to FIGS. 16 and 17 together, in some embodiments, the plurality of camera modules 1100a, 1100b, and 1100c may each include the actuator 1130. Accordingly, the plurality of camera modules 1100a, 1100b, and 1100c may include the same or different calibration data 1147 according to operations of the actuators 1130 included therein. In some embodiments, a camera module (e.g., 1100b) among the plurality of camera modules 1100a, 1100b, and 1100c may be a folded lens type camera module that includes the prism 1105 and the OPFE 1110, and the other camera modules (e.g., 1100a and 1100c) may be vertical camera modules that do not include the prism 1105 and the OPFE 1110, but embodiments are not limited thereto.

In some embodiments, a camera module (e.g., 1100c) among the plurality of camera modules 1100a, 1100b, and 1100c may be, for example, a vertical depth camera that extracts depth information by using infrared rays (IRs). In this case, the application processor 1200 may generate a three-dimensional (3D) depth image merging image data provided from the depth camera and image data provided from another camera module (e.g., 1100a or 1100b).

In some embodiments, at least two camera modules (e.g., 1100a and 1100b) among the plurality of camera modules 1100a, 1100b, and 1100c may have different fields of view from each other. In this case, for example, at least two camera modules (e.g., 1100a and 1100b) among the plurality of camera modules 1100a, 1100b, and 1100c may include different optical lenses from each other, but embodiments are not limited thereto.

In addition, in some embodiments, viewing angles of the plurality of camera modules 1100a, 1100b, and 1100c may be different from one another. In this case, optical lenses included in the plurality of camera modules 1100a, 1100b, and 1100c may be different from one another, but embodiments are not limited thereto.

In some embodiments, the plurality of camera modules 1100a, 1100b, and 1100c may be arranged to be physically separated from one another. That is, a sensing region of the image sensor 1142 is not divided and used by the plurality of camera modules 1100a, 1100b, and 1100c, but the image sensor 1142 may be independently provided in each of the plurality of camera modules 1100a, 1100b, and 1100c.

Referring to FIG. 16 again, the application processor 1200 may include an image processing device 1210, a memory controller 1220, and an internal memory 1230. The application processor 1200 may be separated from the plurality of camera modules 1100a, 1100b, and 1100c. For example, the application processor 1200 and the plurality of camera modules 1100a, 1100b, and 1100c may be semiconductor chips separated from one another.

The image processing device 1210 may include a plurality of sub image processors 1212a, 1212b, and 1212c, an image generator 1214, and a camera module controller 1216. The image processing device 1210 may include the plurality of sub image processors 1212a, 1212b, and 1212c in a number corresponding to the number of the plurality of camera modules 1100a, 1100b, and 1100c. Image data generated by the camera module 1100a, image data generated by the camera module 1100b, and image data generated by the camera modules 1100c may be provided to the sub image processors 1212a, 1212b, and 1212c corresponding thereto through image signal lines ISLa, ISLb, and ISLc separated from one another. For example, the image data generated by the camera module 1100a may be provided to the sub image processor 1212a through the image signal line ISLa, the image data generated by the camera module 1100b may be provided to the sub image processor 1212b through the image signal line ISLb, and the image data generated by the camera module 1100c may be provided to the sub image processor 1212c through the image signal line ISLc. Such image data transmission may be performed by using, for example, a camera serial interface (CSI) based on a mobile industry processor interface (MIPI), but embodiments are not limited thereto.

In some embodiments, one sub image processor may also be arranged to correspond to a plurality of camera modules. For example, the sub image processor 1212a and the sub image processor 1212c may not be separated from each other, unlike that illustrated in FIG. 16, but may be integrated together as one sub image processor, and image data provided from the camera modules 1100a and 1100c may be selected by a selecting element (e.g., a multiplexer) or the like and then provided to the integrated sub image processor.

Image data provided to each of the plurality of sub image processors 1212a, 1212b, and 1212c may be provided to the image generator 1214. The image generator 1214 may generate an output image by using image data provided from each of the plurality of sub image processors 1212a, 1212b, and 1212c according to image generating information or a mode signal.

In particular, the image generator 1214 may generate an output image by merging at least some pieces of image data generated from the plurality of camera modules 1100a, 1100b, and 1100c having different viewing angles from one another according to the image generating information or the mode signal. In addition, the image generator 1214 may generate an output image by selecting any one piece of the image data generated from the plurality of camera modules 1100a, 1100b, and 1100c having different viewing angles from one another according to the image generating information or the mode signal.

In some embodiments, the image generating information may include a zoom signal or zoom factor. In addition, in some embodiments, the mode signal may be, for example, a signal based on a mode selected by a user.

When the image generating information is a zoom signal (zoom factor) and the plurality of camera modules 1100a, 1100b, and 1100c have different fields of view (viewing angles) from one another, the image generator 1214 may perform different operations depending on a type of the zoom signal. For example, when the zoom signal is a first signal, an output image may be generated by using, after merging image data output from the camera module 1100a and image data output from the camera module 1100c, the merged image data and image data output from the camera module 1100b which is not used in merging. When the zoom signal is a second signal different from the first signal, the image generator 1214 may not perform merging of image data, and may generate an output image by selecting any one piece of image data generated from each of the plurality of camera modules 1100a, 1100b, and 1100c. However, embodiments are not limited thereto, and a method of processing image data may be modified and implemented as needed.

In some embodiments, the image generator 1214 may receive a plurality of pieces of image data having different exposure times from one another from at least one of the plurality of sub image processors 1212a, 1212b, and 1212c, and generate merged image data with an increased dynamic range by performing high dynamic range (HDR) processing on the plurality of pieces of image data.

The camera module controller 1216 may provide a control signal to each of the plurality of camera modules 1100a, 1100b, and 1100c. The control signal generated by the camera module controller 1216 may be provided to the plurality of camera modules 1100a, 1100b, and 1100c through control signal lines CSLa, CSLb, and CSLc, which are separated from one another.

Any one of the plurality of camera modules 1100a, 1100b, and 1100c may be designated as a master camera module (e.g., 1100b), and remaining camera modules (e.g., 1100a and 1100c) may be designated as slave cameras, according to the image generating information including the zoom signal or the mode signal. The information may be included in the control signal and may be provided to the plurality of camera modules 1100a, 1100b, and 1100c through the control signal lines CSLa, CSLb, and CSLc, which are separated from one another.

Camera modules operating as a master and a slave may be changed according to a zoom factor or an operation mode signal. For example, when the viewing angle of the camera module 1100a is greater than the viewing angle of the camera module 1100b, and the zoom factor indicates a low zoom ratio, the camera module 1100b may operate as a master, and the camera module 1100a may operate as a slave. On the contrary, when the zoom factor indicates a high zoom ratio, the camera module 1100a may operate as a master, and the camera module 1100b may operate as a slave.

In some embodiments, a control signal provided from the camera module controller 1216 to each of the plurality of camera modules 1100a, 1100b, and 1100c may include a sync enable signal. For example, when the camera module 1100b is a master camera and the camera modules 1100a and 1100c are slave cameras, the camera module controller 1216 may transmit the sync enable signal to the camera module 1100b. The camera module 1100b which has received the sync enable signal may generate a sync signal based on the received sync enable signal, and provide the generated sync signal to the camera modules 1100a and 1100c through a sync signal line SSL. The camera module 1100b and the camera modules 1100a and 1100c may be synchronized with the sync signal to transmit image data to the application processor 1200.

In some embodiments, the control signal provided from the camera module controller 1216 to the plurality of camera modules 1100a, 1100b, and 1100c may include mode information according to a mode signal. Based on the mode information, the plurality of camera modules 1100a, 1100b, and 1100c may operate in a first operation mode and a second operation mode related to a sensing speed.

The plurality of camera modules 1100a, 1100b, and 1100c may generate an image signal (for example, generate an image signal at a first frame rate) at a first rate in the first operation mode to encode the same at a second rate higher than the first rate (for example, encode the image signal at a second frame rate higher than the first frame rate), and transmit the encoded image signal to the application processor 1200. In this case, the second rate may be 30 times or less of the first rate.

The application processor 1200 may store the received image signal, that is, the encoded image signal, in the internal memory 1230 or the external memory 1400 of the application processor 1200, and thereafter read to decode an image signal encoded from the internal memory 1230 or the external memory 1400 and display image data generated based on the decoded image signal. For example, a corresponding sub image processor among the plurality of sub image processors 1212a, 1212b, and 1212c of the image processing device 1210 may perform decoding, and may also perform image processing on the decoded image signal.

The plurality of camera modules 1100a, 1100b, and 1100c may generate an image signal at a third rate lower than the first rate in the second operation mode (for example, generate an image signal at a third frame rate lower than the first frame rate) to transmit the image signal to the application processor 1200. The image signal provided to the application processor 1200 may be a signal which is not encoded. The application processor 1200 may perform image processing on the received image signal or store the image signal in the internal memory 1230 or the external memory 1400.

The PMIC 1300 may supply power, for example, a power supply voltage, to each of the plurality of camera modules 1100a, 1100b, and 1100c. For example, under the control of the application processor 1200, the PMIC 1300 may supply first power to the camera module 1100a through a power signal line PSLa, supply second power to the camera module 1100b through a power signal line PSLb, and supply third power to the camera module 1100c through a power signal line PSLc.

The PMIC 1300 may generate power corresponding to each of the plurality of camera modules 1100a, 1100b, and 1100c in response to a power control signal PCON from the application processor 1200, and also adjust a level of power. The power control signal PCON may include a power adjustment signal for each operation mode of the plurality of camera modules 1100a, 1100b, and 1100c. For example, the operation mode may include a low power mode, and in this case, the power control signal PCON may include information about a camera module operating in the low power mode and a set power level. Levels of power provided to the plurality of camera modules 1100a, 1100b, and 1100c may be the same or different from one another. In addition, the level of power may be changed dynamically.

Figure 18:
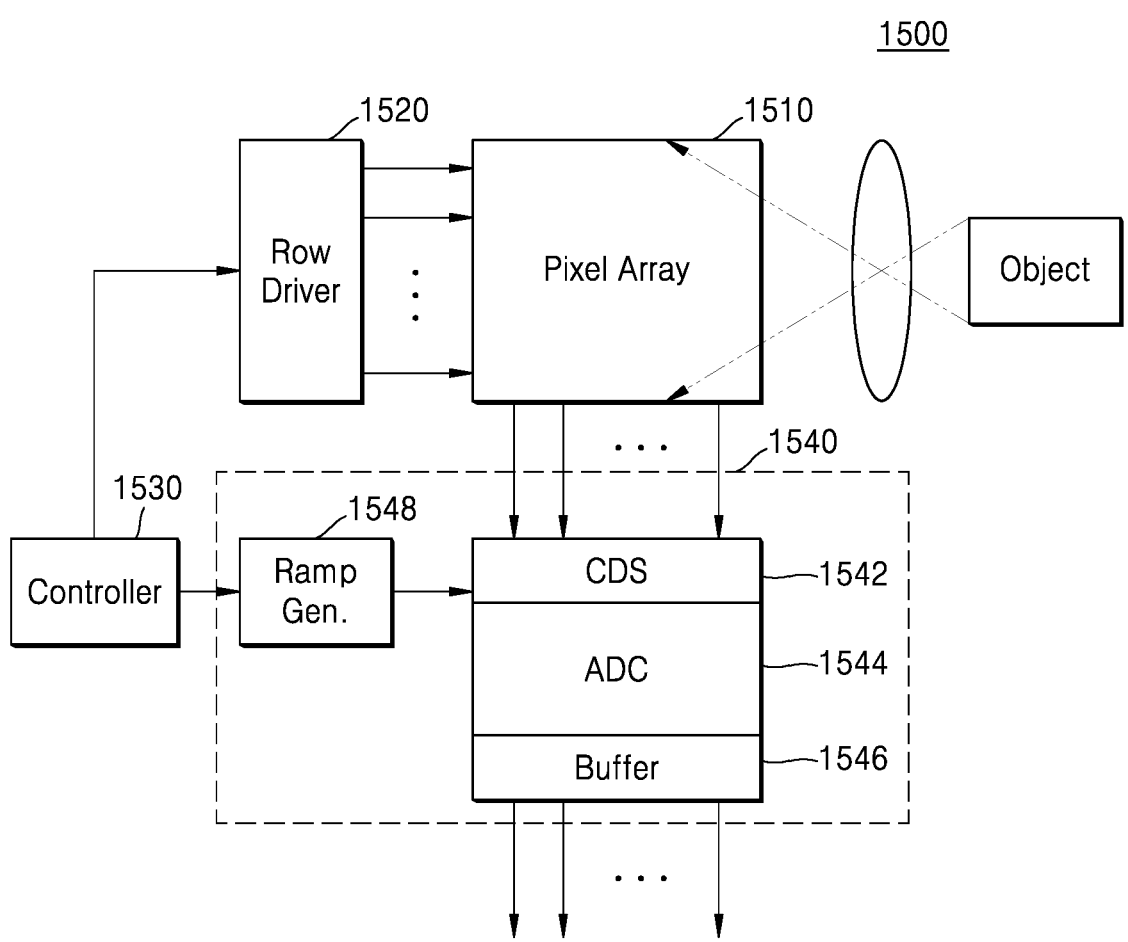
FIG. 18 is a block diagram of a configuration of an image sensor according to an embodiment of the inventive concept.

FIG. 18 is a block diagram of a configuration of an image sensor according to an embodiment of the inventive concept. Referring to FIG. 18, the image sensor 1500 may include a pixel array 1510, a controller 1530, a row driver 1520, and a pixel signal processing unit 1540. The image sensor 1500 may include at least one of the image sensors 100, 200, and 300 described above.

The pixel array 1510 may include a plurality of unit pixels arranged two-dimensionally, and each of the plurality of unit pixels may include a photoelectric conversion device. The photoelectric conversion device may absorb light to generate photocharges, and an electrical signal (output voltage) according to the generated photocharges may be provided to the pixel signal processing unit 1540 through a vertical signal line. Unit pixels included in the pixel array 1510 may provide an output voltage once at a time in a row unit, and accordingly, unit pixels belonging to one row of the pixel array 1510 may be activated simultaneously by a selection signal output by the row driver 1520. Unit pixels belonging to the selected row may provide an output voltage according to the absorbed light to an output line of a corresponding column.

The controller 1530 may control the row driver 1520 to make the pixel array 1510 to absorb light to accumulate photocharges or temporarily store the accumulated photocharges and output an electrical signal according to the stored photocharges to the outside of the pixel array 1510. In addition, the controller 1530 may control the pixel signal processing unit 1540 to measure an output voltage provided by the pixel array 1510.

The pixel signal processing unit 1540 may include a correlated double sampler (CDS) 1542, an analog-to-digital converter (ADC) 1544, and a buffer 1546. The CDS 1542 may sample and hold an output voltage provided by the pixel array 1510.

The CDS 1542 may double-sample a certain noise level and a level according to the generated output voltage to output a level corresponding to a difference therebetween. In addition, the CDS 1542 may receive ramp signals generated by a ramp signal generator 1548 and compare the same to output a comparison result.

The ADC may convert an analog signal corresponding to the level received from the CDS 1542 into a digital signal. The buffer 1546 may latch digital signals, and the latched signals may be sequentially output to the outside of the image sensor 1500 and transmitted to an image processor (not shown).

While the inventive concept has been particularly shown and described with reference to embodiments thereof, it will be understood that various changes in form and details may be made therein without departing from the spirit and scope of the following claims.

What is claimed is:

1. An image sensor, comprising:
   a substrate having first and second opposing surfaces thereon and a photoelectric conversion region therein;
   a first isolation region extending from the first surface into the photoelectric conversion region, and towards the second surface;
   a second isolation region extending from the second surface into the photoelectric conversion region, and towards the first isolation region;
   a plurality of photoelectric conversion devices in a first portion of the photoelectric conversion region; and
   a contact region, which extends from the second surface into a second portion of the photoelectric conversion region that at least partially surrounds the first portion of the photoelectric conversion region, said contact region electrically connected to said first isolation region but electrically isolated and separated from said second isolation region by at least one anti-reflection layer, which extends laterally across the second surface;
   wherein the photoelectric conversion region extends between the first and second isolation regions within the first portion of the photoelectric conversion region, but the second isolation region contacts the first isolation region within the second portion of the photoelectric conversion region; and wherein a spacing between the first and second isolation regions within the first portion of the photoelectric conversion region is in a range from 0.1 um to 0.3 um;
   wherein the at least one anti-reflection layer includes an uppermost anti-reflection layer that extends laterally across the first portion of the photoelectric conversion region but not across the second portion of the photoelectric conversion region; and
   wherein the contact region extends laterally across the second surface of the substrate and contacts a sidewall of the uppermost anti-reflection layer.

2. The image sensor of claim 1, wherein a width of the second isolation region within the second portion of the photoelectric conversion region is greater than a width of the second isolation region within the first portion of the photoelectric conversion region.

3. The image sensor of claim 2, wherein a depth of the second isolation region within the second portion of the photoelectric conversion region, as measured from the second surface, is greater than a depth of the second isolation region within the first portion of the photoelectric conversion region, as measured from the second surface.

4. The image sensor of claim 1, wherein the contact region extends between a first portion of the second isolation region within the second portion of the photoelectric conversion region and a second portion of the second isolation region within the second portion of the photoelectric conversion region, when the contact region and second isolation region are viewed from a cross-sectional perspective.

5. The image sensor of claim 4, wherein the first and second isolation regions have respective grid shapes, when viewed from a plan perspective.

6. The image sensor of claim 1, wherein the second isolation region consists essentially of a first electrically insulating material; and wherein the first isolation region comprises an electrically conductive region, which is separated from the photoelectric conversion region by a second electrically insulating material.

7. The image sensor of claim 6, wherein the first isolation region is formed in a first grid-shaped trench in the first surface of the substrate; wherein the second electrically insulating material lines sidewalls and a bottom of the first grid-shaped trench; and wherein the electrically conductive region extends on the second electrically insulating material to thereby at least partially fill the first grid-shaped trench.

8. The image sensor of claim 7, wherein the second isolation region within the second portion of the photoelectric conversion region contacts the electrically conductive region within a portion of the first grid-shaped trench.

9. The image sensor of claim 1, further comprising a color filter array and a microlens array, which extend on the second surface of the substrate.

10. An image sensor, comprising:

a substrate having first and second opposing surfaces thereon and a photoelectric conversion region extending between the first and second opposing surfaces;

a first isolation region arranged in the substrate in a vertical direction and extending from the first surface towards the second surface;

a second isolation region arranged in the substrate in a vertical direction and extending from the second surface towards a corresponding first isolation region;

a photoelectric conversion device arranged in the substrate in a central portion of the photoelectric conversion region;

a contact region that extends from the second surface towards the first isolation region and is electrically connected to the first isolation region in the vertical direction, in a peripheral portion of the photoelectric conversion region; and at least one anti-reflection layer that extends on the second surface and electrically isolates and separates the contact region from the second isolation region;

wherein the central portion of the photoelectric conversion region is electrically connected to an adjacent portion of the peripheral portion of the photoelectric conversion region that is devoid of a photoelectric conversion device therein by a gap extending between the first isolation region and the second isolation region;

wherein the at least one anti-reflection layer includes an uppermost anti-reflection layer that extends laterally across the central portion of the photoelectric conversion region but not across the peripheral portion of the photoelectric conversion region;

and wherein the contact region extends laterally across the second surface of the substrate and contacts a sidewall of the uppermost anti-reflection layer.

11. The image sensor of claim 10, wherein, in the photoelectric conversion region, the first isolation region of the central portion is apart from the second isolation region in a vertical direction by a first distance, and the first isolation region of the peripheral portion contacts the second isolation region.

12. The image sensor of claim 11, wherein, in the photoelectric conversion region, the first isolation region of the central portion has a first depth, the first isolation region of the peripheral portion has a second depth, and the second depth is greater than the first depth.

13. The image sensor of claim 11, wherein, when viewed in a plan view, each of the first isolation region and the second isolation region has a grid shape, and the contact region is closed by being surrounded by the second isolation region in the peripheral portion.

14. The image sensor of claim 10, further comprising a color filter and a microlens arranged on the second surface of the substrate.

15. An image sensor, comprising:
a substrate having first and second opposing surfaces thereon and a photoelectric conversion region therein, which extends between the first and second opposing surfaces;

a two-dimensional array of photoelectric conversion devices in an image capture portion of the photoelectric conversion region, which is surrounded by a peripheral portion of the photoelectric conversion region that is devoid of photoelectric conversion devices therein;

a first grid-shaped isolation region extending from the first surface into the photoelectric conversion region, and towards the second surface; and a second grid-shaped isolation region vertically aligned with the first grid-shaped isolation region, said second grid-shaped isolation region extending from the second surface into the photoelectric conversion region, and towards the first surface;

an electrically conductive contact region, which extends on the second surface, penetrates into the peripheral portion of the photoelectric conversion region, and contacts a portion of the first grid-shaped isolation region; and at least one anti-reflection layer that extends on and laterally across the second surface, electrically isolates and physically separates the contact region from the second grid-shaped isolation region;

wherein the two-dimensional array of photoelectric conversion devices are electrically coupled to each other by respective portions of the image capture portion of the photoelectric conversion region that extend in gaps between the first and second grid-shaped isolation regions;

wherein a first portion of the peripheral portion of the photoelectric conversion region is electrically coupled to at least one photoelectric conversion device extending along an edge of the two-dimensional array thereof by a gap between the first and second grid-shaped isolation regions;

wherein the at least one anti-reflection layer includes an uppermost anti-reflection layer that extends laterally across the image capture portion of the photoelectric conversion region but not across the peripheral portion of the photoelectric conversion region; and wherein the contact region extends laterally across the second surface of the substrate and contacts a sidewall of the uppermost anti-reflection layer.

16. The sensor of claim 15, wherein a portion of the second grid-shaped isolation region in a peripheral portion of the photoelectric conversion region that is devoid of photoelectric conversion devices therein is wider than a portion of the second grid-shaped isolation region in the image capture portion of the photoelectric conversion region.

* * * * *